United States Patent
Rubin et al.

(10) Patent No.: US 11,587,896 B2
(45) Date of Patent: Feb. 21, 2023

(54) TRANSFERRABLE PILLAR STRUCTURE FOR FANOUT PACKAGE OR INTERCONNECT BRIDGE

(71) Applicant: International Business Machines Corporation, Armonk, NY (US)

(72) Inventors: Joshua M. Rubin, Albany, NY (US); Yang Liu, Yorktown Heights, NY (US); Steven Lorenz Wright, Cortlandt Manor, NY (US); Paul S. Andry, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/115,882

(22) Filed: Dec. 9, 2020

(65) Prior Publication Data
US 2022/0181286 A1    Jun. 9, 2022

(51) Int. Cl.
*H01L 23/00* (2006.01)
*H01L 23/538* (2006.01)

(52) U.S. Cl.
CPC .......... *H01L 24/13* (2013.01); *H01L 23/5381* (2013.01); *H01L 24/11* (2013.01); *H01L 2224/11462* (2013.01); *H01L 2224/11849* (2013.01); *H01L 2224/1308* (2013.01); *H01L 2224/13019* (2013.01)

(58) Field of Classification Search
CPC ..... H01L 24/13; H01L 23/5381; H01L 24/11; H01L 2224/11462; H01L 2224/11849; H01L 2224/13019; H01L 2224/1308
See application file for complete search history.

(56) References Cited

U.S. PATENT DOCUMENTS

| | | | |
|---|---|---|---|
| 8,193,034 B2 | 6/2012 | Pagaila et al. | |
| 9,006,031 B2 | 4/2015 | Camacho et al. | |
| 9,070,586 B1 * | 6/2015 | Dang | B23K 35/025 |
| 9,200,883 B2 | 12/2015 | Andry et al. | |
| 9,263,361 B2 | 2/2016 | Pagaila et al. | |
| 9,391,040 B2 | 7/2016 | Dang et al. | |
| 10,001,508 B2 | 6/2018 | Liu et al. | |
| 10,468,363 B2 | 11/2019 | Prevatte et al. | |
| 2013/0307144 A1 | 11/2013 | Yu | |
| 2015/0241476 A1 | 8/2015 | Dang | |
| 2016/0084882 A1 | 3/2016 | Dang et al. | |
| 2019/0198445 A1 | 6/2019 | Mur et al. | |

(Continued)

FOREIGN PATENT DOCUMENTS

CN    103066043 A    4/2013

OTHER PUBLICATIONS

International Search Report and Written Opinion for Application PCT/IB2021/060500, dated Mar. 2, 2022, 8 pages.

(Continued)

*Primary Examiner* — Douglas W Owens
(74) *Attorney, Agent, or Firm* — Jeffrey M. Ingalls

(57) ABSTRACT

A pillar structure is provided. The pillar structure includes a plurality of pillars. Each of the pillars include a capping material layer formed in a pit etched into a template wafer, a conductive plug formed on the capping material layer, a base layer formed on the conductive plug, and an attach material layer formed on the base layer. The pillars are joined vertically together to form the pillar structure.

10 Claims, 23 Drawing Sheets

(56) References Cited

U.S. PATENT DOCUMENTS

2020/0335443 A1* 10/2020 Sun Zhou ............ H01L 21/6835
2021/0175174 A1*  6/2021 Farooq ................ H01L 23/5385

OTHER PUBLICATIONS

Fowler et al., "Advances in temporary bonding and debonding technologies for use with wafer-level system-in-package (WLSiP) and fan-out wafer-level packaging (FOWLP) processes," International Symposium on Microelectronics, vol. 2018, No. 1, International Microelectronics Assembly and Packaging Society, 2018, 7 pages.

Fowler et al., "Investigation and Methods Using Various Release and Thermoplastic Bonding Materials to Reduce Die Shift and Wafer Warpage for eWLB Chip-First Processes," 69th Electronic Components and Technology Conference (ECTC), 2019, 7 pages.

\* cited by examiner

TRANSFERRABLE PILLAR STRUCTURE FOR FANOUT PACKAGE OR INTERCONNECT BRIDGE

BACKGROUND

The present disclosure relates to the electrical, electronic and semiconductor device fields. In particular, the present disclosure relates to transferrable pillar structures, and methods of forming pillar structure, for a fanout package or interconnect bridge for an article, such as a semiconductor integrated circuit (IC) chip.

Typical semiconductor integrated circuit (IC) chips have layers stacked such that layer features overlay one another to form individual devices and connect devices together. ICs are mass produced by forming an array of chips on a thin semiconductor wafer. Each array location is known as a die and each die may harbor a multilayered structure, such as an IC chip or a structure for test or alignment.

As transistor technologies have evolved, chip features and devices have gotten smaller and smaller and have minimum dimensions that typically are well below one micrometer (1 µm) or 1 micron. Smaller chip features and devices allow IC manufacturers to integrate more function in the same chip real estate. A typical IC can include billions of transistors wired together into circuits providing chip function. IC circuits may also include micro-machine structures such as micro-sensors or other micro-electro-mechanical systems (MEMS) structures. A typical MEMS structure, such as a cantilever and membrane formation, has been formed by stacking multiple layers of interlevel vias beneath a surface wiring structure and undercutting the surface wiring without damaging surrounding features.

The surface layer of each completed chip or die is typically populated by probe-able off-chip pads for connecting to chip power and input/output (I/O) signals. Packing more function on each die typically means providing more and more I/O signals for each die, on one (top), or for a three dimensional (3D) chip structure, both (top and bottom) sides. Each die has at least one surface pad for each I/O signal and a number of power (supply and ground) connection pads. Providing these I/O signals and supply as die are shrinking in size, therefore, driving more stringent off-chip I/O connection requirements, i.e., increasingly dense I/O pad arrays. On a typical state of the art IC wafer, for example, the surface layer of each die may be populated by several thousand connection pads. To achieve this requires ultra-fine pitch pads on very tight a pitch less than 50 microns (<50 µm).

For heterogeneous integration of multiple chips in a package, it is often desired to incorporate a silicon bridge structure above the laminate to provide fine-pitch wiring connecting two or more active die. This structure may require electrical interconnections of two different heights, and possibly different lateral sizes. Some interconnections may require high-aspect ratio structures (i.e., a large height-to-pitch ratio). Moreover, face-to-face interconnections may be needed between two different pitches.

SUMMARY

Embodiments of the present disclosure relate to a pillar structure. The pillar structure includes a plurality of pillars. Each of the pillars include a capping material layer formed in a pit etched into a template wafer, a conductive plug formed on the capping material layer, a base layer formed on the conductive plug, and an attach material layer formed on the base layer. The pillars are joined vertically together to form the pillar structure.

Other embodiments of the present disclosure relate to a method of forming a pillar structure. The method includes: forming a plurality of pillars, each pillar formed by forming a capping material layer in a pit etched into a template wafer, forming a conductive plug on the capping material layer, forming a base layer on the conductive plug, and forming an attach material layer on the base layer; and joining the pillars vertically together to form the pillar structure.

Other embodiments are related to a bridge structure. The bridge structure includes a substrate; a bridge formed on the substrate; a plurality of pillar stacks formed on the substrate, each pillar stack including a plurality of pillars formed on top of each other, each pillar including a capping material layer, a conductive plug formed on the capping material layer, a base layer formed on the conductive plug, and an attach material layer formed on the base layer; and a plurality of chips formed on top of the pillar stacks.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

Figure 1A:
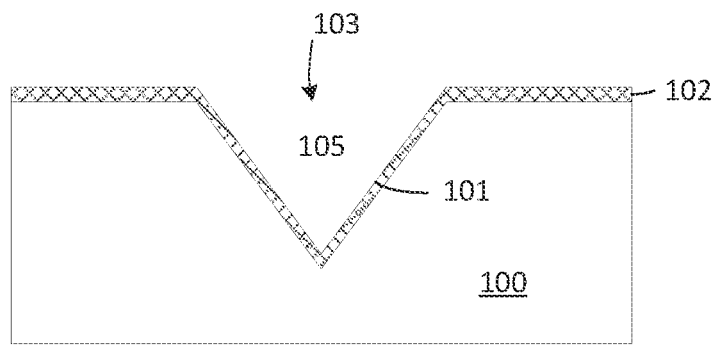
FIG. 1A is a cross-sectional view of an example of a template wafer, pitted at protrusion locations, at an intermediate stage of the manufacturing process, according to embodiments.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes pillar structures usable in conjunction with a fanout structure or interconnect bridge. In particular, the present disclosure describes a pillar structure that includes a plurality of pillars. Each of the pillars include a capping material layer formed in a pit etched into a template wafer, a conductive plug formed on the capping material layer, a base layer formed on the conductive plug, and an attach material layer formed on the base layer. The pillars are joined vertically together to form the pillar structure. The pillars may be stacked on top of each other to form a desired total height of the pillar structure, and the pillar structures may be used in the fanout structure or interconnect bridge.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, there are two methods to create tall (i.e., high aspect ratio) interconnections, each of the method having certain shortcomings. One of these methods is to use Cu balls, dropped through a sieve and soldered with a height-to-width ratio=1 for a sphere. Another one of these methods is to use plated Cu pillars, typically plated on the die. In this second method, a pillar height-to-width aspect ratio is at most 2:1 to 3:1. In this second method, there is a fundamental limitation of plating through a patterned wet or dry film mask.

The present embodiments provide for the transfer of a plated pillar structure from another substrate to the die, using a release process. The selected-area transfer places pillars only in the required regions. Moreover, in certain embodiments, the required regions for selective transfer are those that contain a capture pad. In other words, the pillars will be transferred only if there is a corresponding capture pad. Also, multiple transfers can be made using a flip-chip bond process to create a high-aspect ratio structure with precise lithography controlled height. The height can be controlled by using a flip chip bonder in position mode. Moreover, the height can be controlled by having multiple tips act as a "stop", with interspersed solder layers.

For heterogeneous integration of multiple chips in a package, it is often desired to incorporate a silicon bridge structure above the laminate to provide fine-pitch wiring connecting two or more active die. This structure may require electrical interconnections of two different heights, and possibly different lateral size. Some interconnections may require high-aspect ratio structures, i.e. large height-to-pitch ratio. Face-to-face interconnections may be needed between two different pitches. Given these challenges for constructing a package with an interconnect bridge that may require different pitch and height considerations for each chip, the embodiments of the present disclosure use transferable pillar structures to enable precise tuning of pillar feature sizes to create offsets for the bridge structure.

The present embodiments utilize a transferrable pillar method to create a pillar structure on a separate substrate and selectively transfer the structures to the desired package to form offsets for a chip in a fanout package or a bridge structure. This process can be repeatedly performed to further increase the total pillar structure height, without being limited by aspect ratio.

Referring now to the drawings, and initially to FIG. 1A, this figure is a cross-sectional view of an example of a template wafer, pitted at protrusion locations, at an intermediate stage of the manufacturing process, according to embodiments. Certain of the steps below include an electrochemical plating step in the manufacturing process. As shown in FIG. 1A, a template wafer 100 is pitted 105 in at least at one protrusion location 103 (see also FIG. 1B) and covered with a low adhesion surface layer or seed layer 102 that coats each pit 105. It should be appreciated that although a single pit 105 is shown in FIG. 1A, the template wafer 100 may include a plurality of the pits 105. The coated pit 105 provide a non-planar surface that causes local current crowding in each pit 105 that helps nucleation in the pit 105 without risking current stability because the anchoring effect allows continuous current supply. Further, the pit 105 cavities provide a fluid boundary layer, that provides for mass transfer by diffusion rather than bulk flow, and that prevents bath agitation from unintentionally detaching nucleates. Moreover, when electroplating a continuous film on the template wafer 100, the seed layer 102 in cooperation with the underlying structure (pit 105) anchor the film to prevent delamination, while supplying stable, uniform current for continuous deposition. Because the nucleate adheres to the seed layer 102, and the seed layer 102 adheres to the pit 105 and horizontal surfaces there between, the electroplating solution remains relatively free of particulate contamination. The pit 105 allows subsequently plated horizontal film expansion to release stress. Finally, the stressed material forming the template wafer 100 facilitates thicker breakage-free plating, releasing stress both in metal plated the cavities, and by film delamination on flat portions between adjacent pits 105. Further, the template wafer 100 may be refreshed and reused for fabricating and attaching protrusions to additional articles.

In certain embodiments, the template wafer 100 is a silicon wafer with prismatic, conical, cylindrical or pyramidal pits 105. In this example, the pit 105 has an inverted pyramid shape with a square base and equilateral triangle shaped sides 101. For bumping an IC chip with an array of micro-pillars, or a ball grid array (BGA) of micro-C4s at 50 micrometers or microns (50 µm) and below, or for forming a test probe for such a wafer, the pit 105 is 1-25 µm deep, preferably 8 µm deep, with a surface diagonal/diameter 1-50 µm, for example 14 µm. The pit 105 may be formed using any well-known semiconductor pattern and etch process, e.g., such as is used for trench formation in deep or shallow trench isolation (STI). Any suitable wet or dry etch may be used. For example, an anisotropic wet etch using Tetramethylammonium hydroxide (TMAH or TMAOH), etches the pyramidal pit 105 in the surface of template wafer 100. In another example, KOH may be used for the wet etching. Further, as the pit 105 may be formed using a well-known pattern and etch, the pit 105 is scalable down to any size and any pitch, depending upon the particular technology features selected.

The seed layer 102 coats each pit 105, and in certain embodiments, the seed layer 102 has a plurality of sublayers (not shown in FIG. 1A) that are metal layers. In one example, as a first sublayer, the seed layer 102 includes a base layer, e.g., titanium, formed directly on the silicon template wafer 100 to insure good adhesion to the template wafer 100 (e.g., a silicon substrate). In this example, as a second sublayer, the seed layer 102 includes a highly conductive layer (not shown), e.g., copper (Cu), silver (Ag) or gold (Au), formed on the base layer to insure uniform current distribution, and to maintain current stability during electroplating. In this example, as a third sublayer, the seed layer 102 includes a surface layer (not shown) of seed material, e.g., Ti, is formed on the highly conductive layer. Native oxide (not shown) formed on Ti surface layer insures sufficiently low adhesion to the Ti surface layer to allow for subsequently separating the electroplated material with relatively low force.

The surface non-linearity or other surface roughness, pits in this example, facilitates plating nucleation, maintains adherence of subsequently plated metal to the template wafer during plating, with sufficiently low adhesion release the plated with relatively low force. Other suitable seed materials may include, for example, stainless steel and chromium (Cr). Also, the seed layer 102 may be a single metal layer (e.g., as shown in FIG. 1A), if that layer sufficiently adheres to the template wafer 100 and provides sufficiently uniform current distribution.

Figure 1B:
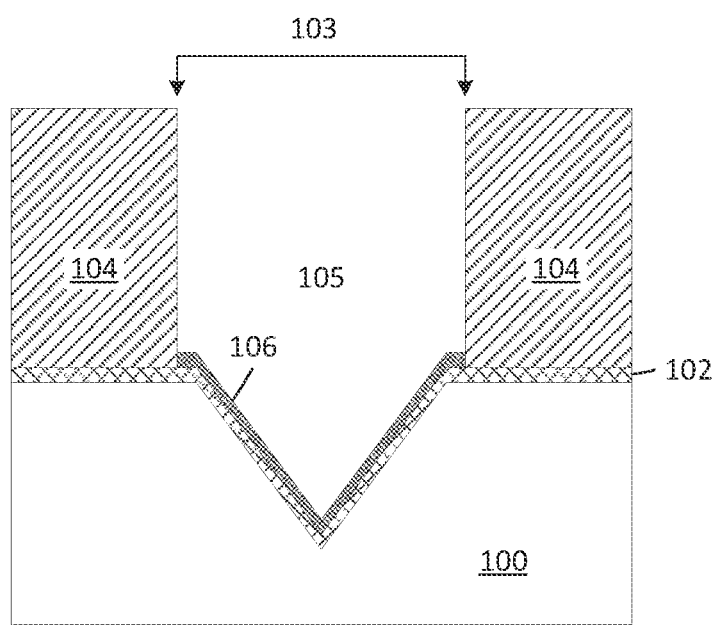
FIG. 1B is a cross-sectional view of an example of forming a transfer in the template wafer of FIG. 1A, at a subsequent stage of the manufacturing process, according to embodiments.

Referring now to FIG. 1B, this figure is a cross-sectional view of an example of forming a transferrable pillar in the template wafer 100 of FIG. 1A, at a subsequent stage of the manufacturing process, according to embodiments. In certain embodiments, as shown in FIG. 1B, each transferrable pillar includes a capping material layer (or hard cap layer 106) forming a hard tip cap, electroplated to the seed layer 102 after forming and patterning a sacrificial layer 104 on the template wafer 100. The patterned sacrificial layer 104 defines a protrusion location 103 above each pit 105 that is coated with the seed layer 102. Alternately, in a multi-pointed tip embodiment, each transferrable pillar is formed over multiple pits 105 with the surface between the pits 105 uninterrupted by the patterned sacrificial layer 104 and subsequent plating uniformly occurring at the pits 105 and there-between. In this single-pointed tip example, the hard cap layer 106 cover the seed layer 102 only at the protrusion locations 103, and completely line the pits 105. In certain embodiments, the capping material of the hard cap layer 106 is nickel (Ni), cobalt (Co), iron (Fe), gold (Au) or a suitable refractory metal, or an alloy thereof, electroplated to a thickness of, for example, 1-30 µm, preferably 5 µm.

Figure 1C:
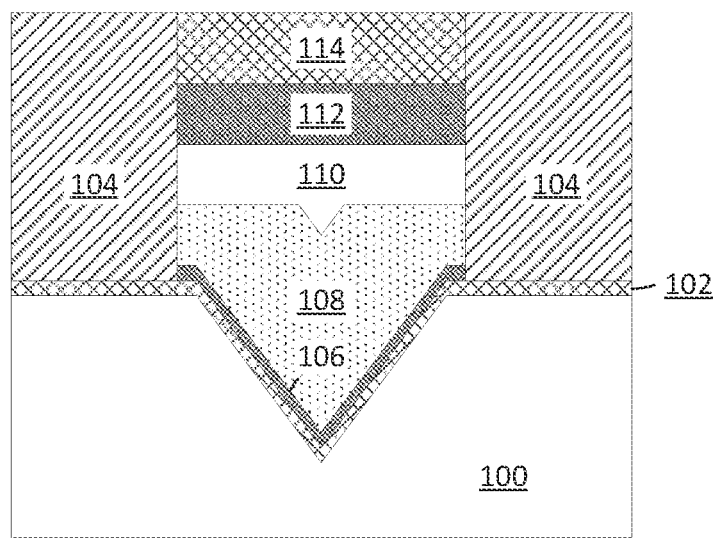
FIG. 1C is a cross-sectional view of an example of forming a transferrable pillar the template wafer of FIG. 1B, at a subsequent stage of the manufacturing process, according to embodiments.

Referring now to FIG. 1C, this figure is a cross-sectional view of an example of forming the transferrable pillar 150 in the template wafer 100 of FIG. 1B, at a subsequent stage of the manufacturing process, according to embodiments. As shown in FIG. 1C, a conductive plug 108, e.g., copper, is plated to the hard cap layer 120, such that the plated copper conductive plug 108 has a minimum thickness of, for example, 1-100 µm, preferably 10 µm. Next, a base layer 110, preferably nickel, is electroplated to the conductive plug 108. Next, an intermediate layer 112 of, for example, gold, is applied to the base layer 110. In certain embodiments, the intermediate layer 112 may be omitted. Then, an attach material 114, preferably, lead-free solder, such as a tin/silver (Sn/Ag) solder, is electroplated to the base layer intermediate layer 112. In this example, the base layer 110 is 0.5-3 µm, preferably 2 µm, thick; and the attach material 114 is 1-100 µm, preferably 10 µm, thick. Also, in this example, the inverted metal protrusions, or transferrable pillar 150 (i.e., the cap layer 106, the conductive plug 108, the base layer 110, the intermediate layer 112 and the attach material 114), completely fill each pit 105 (see FIG. 1B). In the example shown in FIG. 1B, the conductive plug 108 is shown to only partially fill (or planarize) the pit 105 (i.e., there is a small portion at the top of the conductive plug 108 that still has a shape of the pit 105). However, it should be appreciated that in other examples enough material of the conductive plug 108 is used to completely fill the pit 105.

Figure 1D:
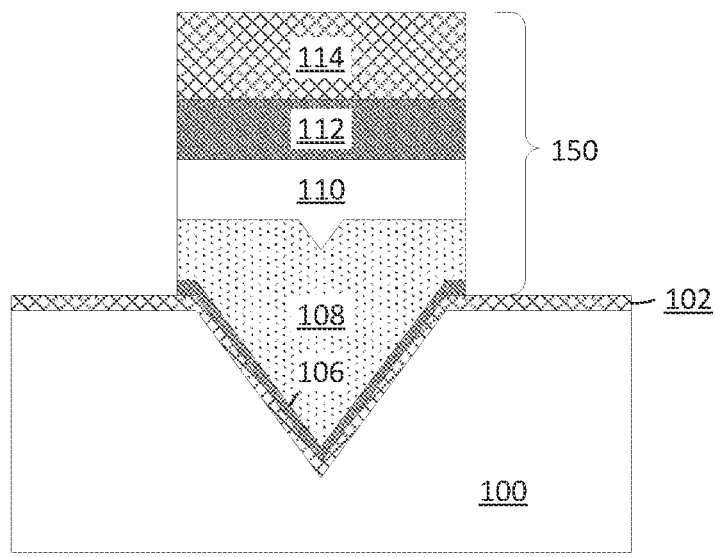
FIG. 1D is a cross-sectional view of an example of forming a tip of the transferrable pillar in the template wafer of FIG. 1C, at a subsequent stage of the manufacturing process, according to embodiments.

Referring now to FIG. 1D, this figure is a cross-sectional view of an example of forming the transferrable pillar 150 in the template wafer 100 of FIG. 1C, at a subsequent stage of the manufacturing process, according to embodiments. As shown in FIG. 1D, the patterned sacrificial layer 104 is removed in by any typical wet strip, rinse, and dry process. This removal step exposes the inverted transferrable pillar 150 in FIG. 1D. Even though adhesion is relatively low, there is still sufficient adhesion to hold the features (i.e., the inverted transferrable pillar 150) in place when the resist material of the patterned sacrificial layer 104 is stripped away.

Figure 1E:
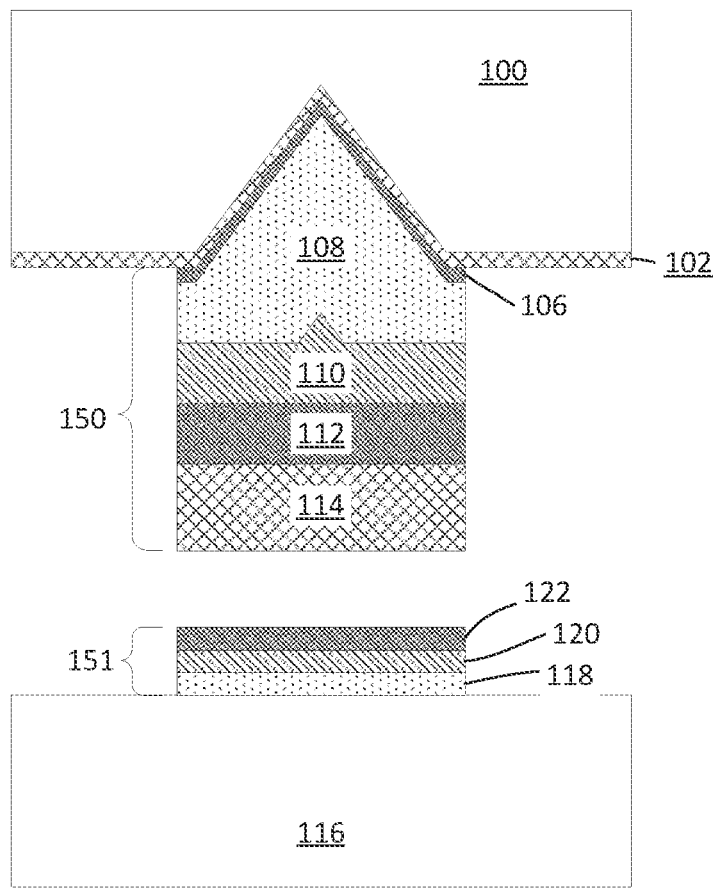
FIG. 1E is a cross-sectional view of an example of forming the tip of the transferrable pillar in the template wafer of FIG. 1D, at a subsequent stage of the manufacturing process, according to embodiments.

Referring now to FIG. 1E, this figure is a cross-sectional view of an example of forming the transferrable pillar 150 in the template wafer 100 of FIG. 1D, at a subsequent stage of the manufacturing process, according to embodiments. As shown in FIG. 1E, the transferrable pillar 150 is inverted relative to the perspective shown in FIG. 1 and is moved into position to be attached to an article 116. In certain embodiments, the article 116 (or transfer substrate) may be a ceramic, silicon or organic substrate, as shown in FIG. 1E. In other embodiments, if the article 116 may be glass if it is a temporary carrier. In this example, a pad 151 is a layered pad that includes a base layer 118, preferably copper, formed on the article 116, an interface layer 120, preferably nickel, formed on the base layer 118, and an anti-oxidation layer 122, preferably gold, formed on the interface layer 120. Although described with reference to soldering, any suitable attachment method, e.g., gluing, may be used for attaching the transferrable pillar 150 to the pad 151.

Figure 1F:
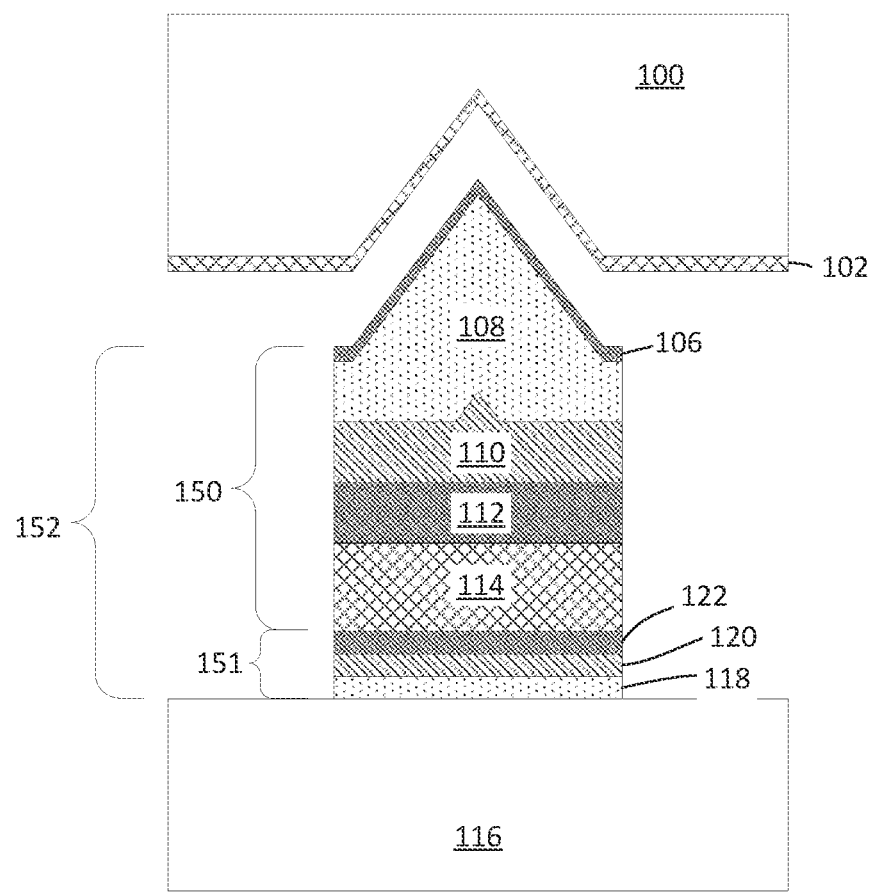
FIG. 1F is a cross-sectional view of an example of the transferrable pillar after it has been attached to the article and after the transferrable pillar has been detached from the template wafer, according to embodiments.

Referring now to FIG. 1F, this figure is a cross-sectional view of an example of the transferrable pillar 150 after it has been attached to the article 116 and after the transferrable pillar 150 has been detached from the template wafer 100, according to embodiments. As shown in FIG. 1F, the exposed metal protrusions (i.e., the transferrable pillar 150) is attached to the article 116, e.g., it is soldered to pad 151 on the article 116 by reflowing the solder based attach material 114. Once the transferrable pillar 150 is attached to the pad 151, the template wafer 100 is separated from the completed transferred pillar 152 (i.e., the transferrable pillar 150 and the pad 151) (which may also be referred to as a transferred pillar), using very little force to pry or pull the template wafer 100 off. Moreover, because the transferred pillar 152 can be lithographically defined, a plurality of the transferred pillars 152 can be very fine pitched, and they can be formed at a very uniform height.

Figure 1G:
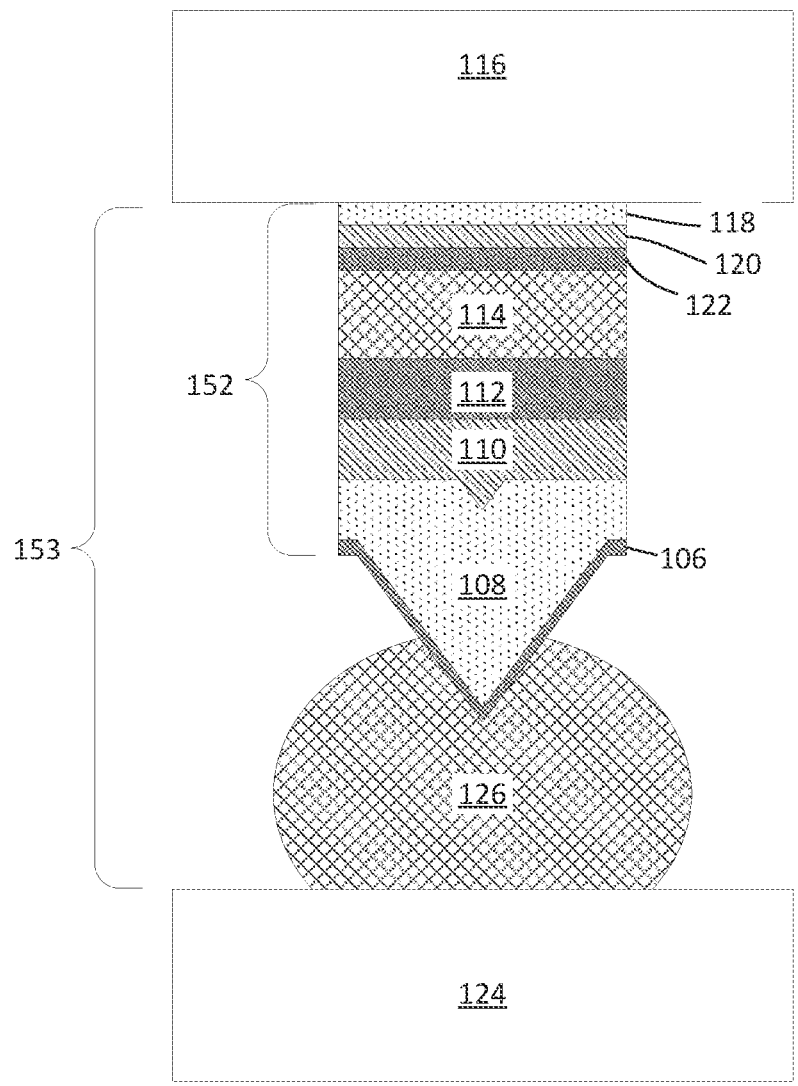
FIG. 1G is a cross-sectional view of an example of the transferrable pillar of FIG. 1F after it has been detached from the template wafer, and after the tip of the transferrable pillar has been pierced into a solder ball, according to embodiments.

Referring now to FIG. 1G, this figure is a cross-sectional view of an example of the transferred pillar 152 after it has been detached from the template wafer 100, and after the tip of the transferred pillar 152 has been pierced into a solder ball 126, according to embodiments. It should be appreciated that in several of the embodiments described herein the tip of the transferred pillar 152 is pointed or sharp. However, in other embodiments, the tip of the transferred pillar 152 does not necessarily have a sharp pointed profile. Moreover, although the tip of the transferred pillar 152 in the example embodiments of FIGS. 1A-1G has a four sided pyramid shape, other suitable shapes may be utilized (e.g., a conical shape, or a flat shape). As shown in FIG. 1G, a solder substrate 124 is provided with a solder ball 126 formed thereon. As the article 116 is moved closer to the solder substrate 124, the tip of the transferred pillar 152 is partially (or completely) embedded into the solder ball. In certain embodiments, the solder ball 126 may be heated to soften the ball (i.e., without completely melting or reflowing the solder), which may allow for an increased amount of penetration of the tip of the transferred pillar 152 into the solder ball 126. In certain embodiments, after insertion of the tip of the transferred pillar 152, there is a mechanical interlock between the solder ball 126 and the transferred pillar 152, which may help in resisting any subsequent separation of the transferred pillar 152 from the solder ball 126. In certain embodiments, after the tip of the transferred pillar 152 has been inserted into the solder ball 126, the article 116 (i.e., the upper substrate in FIG. 1G) is removed, leaving a completed structure 153 (i.e., the transferred pillar 152 and solder ball 126) on the solder substrate 124). As described in further detail below, a plurality of these completed structures 153 may be stacked on top of one another to form a pillar of a desired total height. Moreover, a plurality of different pillars may be formed with different numbers of stacked completed structures 153, resulting in pillars of different total heights. Thus, by having pillars with different heights, this may enable electrical interconnections of two or more different heights. As mentioned above, it is often desired to incorporate a silicon bridge structure above a laminate to provide fine pitched wiring connecting two or more active die, and this structure may require electrical interconnections of different heights. The pillars comprising one or more of the completed structures 153 of the present embodiments may accommodate for these different heights.

Figure 1H:
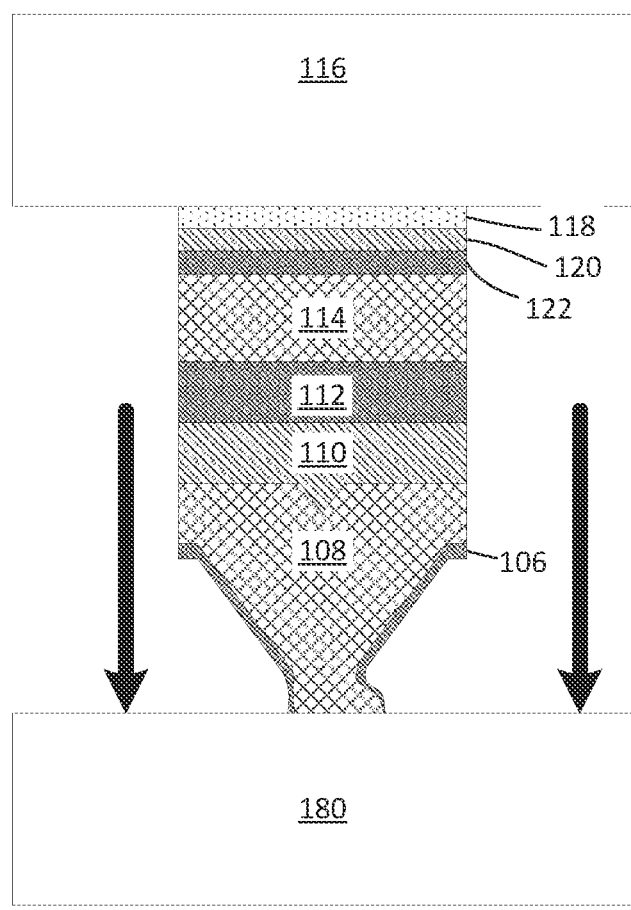
FIG. 1H is a cross-sectional view of an example of the transferrable pillar of FIG. 1F after it has been detached from the template wafer, and after the tip of the transferrable pillar has been subjected to a coining process to form a flattened tip shape or hooked tip shape, according to embodiments.

Referring now to FIG. 1H, this figure is a cross-sectional view of an example of the transferred pillar 152 of FIG. 1F after it has been detached from the template wafer 100, and after the tip of the transferred pillar 152 has been coined (or deformed) to form a hook shape, according to embodiments. As shown in FIG. 1H, the transferred pillar 152 is pushed on to a deforming substrate 180 until the tip of the transferred pillar 152 is somewhat deformed (i.e., a coining operation) or flattened. In certain examples, this coining process results in a somewhat hooked shape of the top of the transferred pillar 152, and this helps with the mechanical interlock between the solder ball 126 and the transferred pillar 152.

Figure 2A:
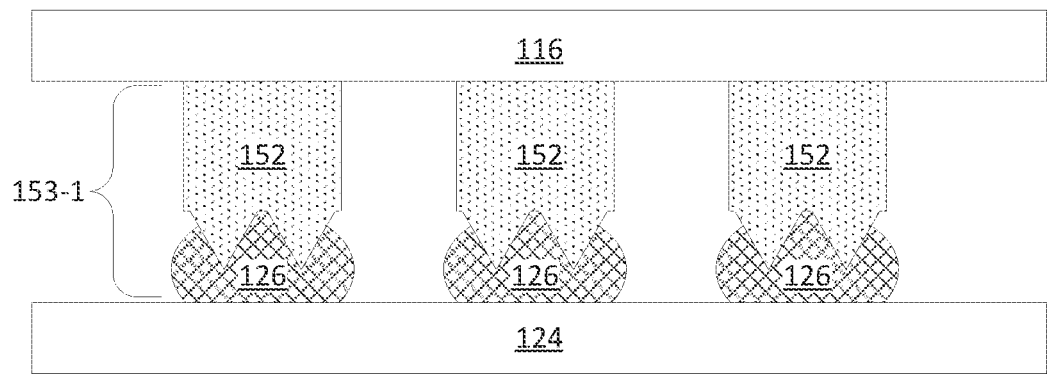
FIG. 2A a cross-sectional view of an example of the first completed structure of FIG. 1G, after the tip of the transferrable pillar is inserted into the solder ball and before the article is removed, according to embodiments.

In the various embodiments described herein, the completed transferred pillar 152 is used in many different stacking configurations (i.e., where a plurality of completed structures 153 including the transferred pillars 152 and solder balls 126 are stacked on top of each other) to enable many different fanout capabilities and configurations. That is, the completed structure of the transferred pillar 152 (or stacks of a plurality of completed structures 153) may function as a spacer that enables these different fanout configurations. In other words, the completed structures 153 may be built up to different heights to accommodate different fanouts. Although the example of FIGS. 1A-1H shows a single tip on the transferred pillar 152, it should be appreciated that the transferred pillar 152 may include a plurality of different tips (e.g., two tips as shown in FIG. 2A) to prevent or minimize tilting of the pillar. In other words, a transferred pillar 152 having two or more tips has a plurality of contact points with whatever surface the tips come into contact with, and these plurality of tips provide a certain measure of vertical stability to the high aspect ratio pillar. It should be appreciated that one transferred pillar 152 by itself may have the ability to function as a probe, but in the present embodiments, the completed structures 153 function as a spacer (or an interconnect pillar) or a conductive structure that is akin to a very fine pitched lithographically formed pin grid array.

Figure 2B:
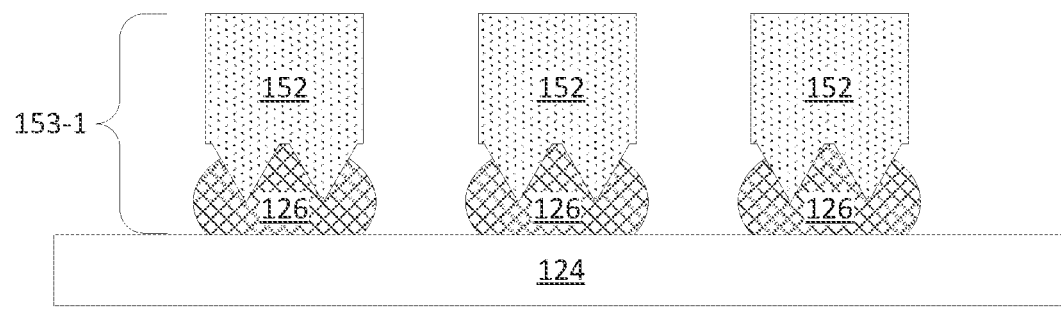
FIG. 2B is a cross-sectional view of the first completed structure shown in FIG. 2A, after the article has been removed, according to embodiments.

Referring now to FIGS. 2A-2G, and initially to FIG. 2A, this figure is a cross-sectional view of an example of a first completed structure 153-1 of FIG. 1G (i.e., the transferred pillar 152 and the solder ball 126) after the tip of the transferred pillar 152 is inserted into the solder ball 126 and before the article 116 is removed, according to embodiments. For the ease of illustration, the transferred pillar 152 is not depicted with all of the component layers described above with respect to FIGS. 1A-1G. As shown in FIG. 2B, the article 116 is removed, leaving the first completed structure 153-1 on the solder substrate 124.

Figure 2C:
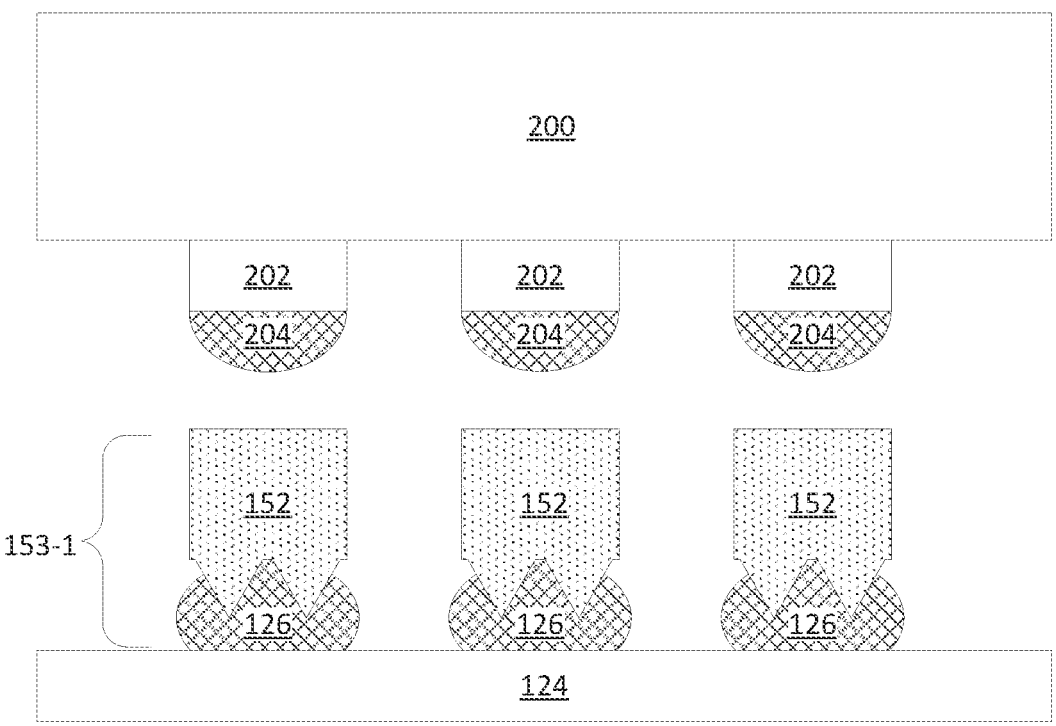
FIG. 2C is a cross-sectional view of the first completed structure shown in FIG. 2B, prior to being transferred to a transferred substrate, according to embodiments.

Referring now to FIG. 2C, this figure is a cross-sectional view of an example of the first completed structure 153-1 shown in FIG. 2B, prior to being transferred to a transferred substrate 200 (e.g., a substrate of a device die). As shown in FIG. 2C, a transferred substrate 200 is provided with, for example, a copper layer 202 and a solder layer 204. The solder substrate 124 is positioned so that the first completed structure 153-1 formed thereon is brought into proximity with the solder layer 204 of the transferred substrate 200.

Figure 2D:
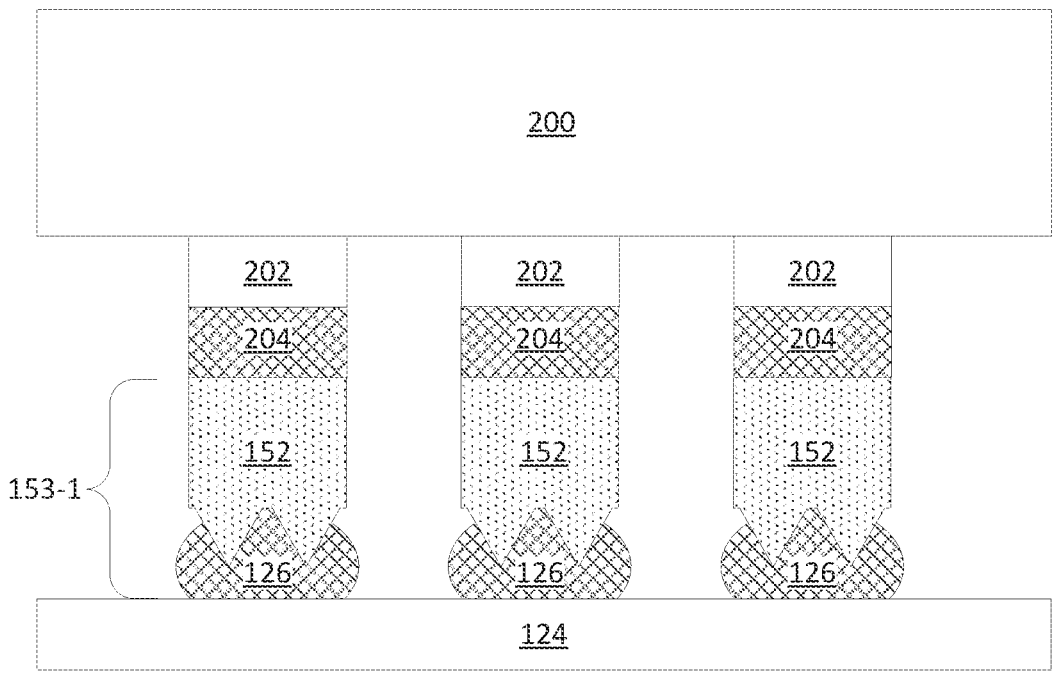
FIG. 2D is a cross-sectional view of a pillar structure including the first completed structure shown in FIG. 2C, after being transferred to a transferred substrate, according to embodiments.

As shown in FIG. 2D, the solder substrate 124 is moved closer to the transferred substrate 200 so that the transferred pillar 152 comes into contact with the solder layer 204. Then, the solder layer 204 is reflowed to connect the transferred pillar 152 with the copper layer 202 of the transferred substrate 200.

In certain embodiments, as an alternative to the process of transferring the transferrable pillars 150 from the template wafer 100 to the article 116 (e.g., where the article may be a ceramic, silicon, or organic substrate) as shown in FIG. 1F, and then from the article 116 to the solder substrate 124 as shown in FIG. 2B, and then from the solder substrate 124 to the transferred substrate 200 shown in FIG. 2C, the transferrable pillars 150 may be directly bonded on to the transferred substrate 200. That is, the transferrable pillars 150 could be transferred without the use of the solder substrate, in certain embodiments. In other words, there may be any suitable number of different types of ways to transfer the transferrable pillars 150 to the final destination substrate. Also, in other embodiments it should be appreciated that the pointed tips of the transferrable pillars 150 may arrive at their final destination substrate with the tips oriented in an upward direction or a downward direction. That is, the tips could be facing either an upward or downward direction.

Figure 2E:
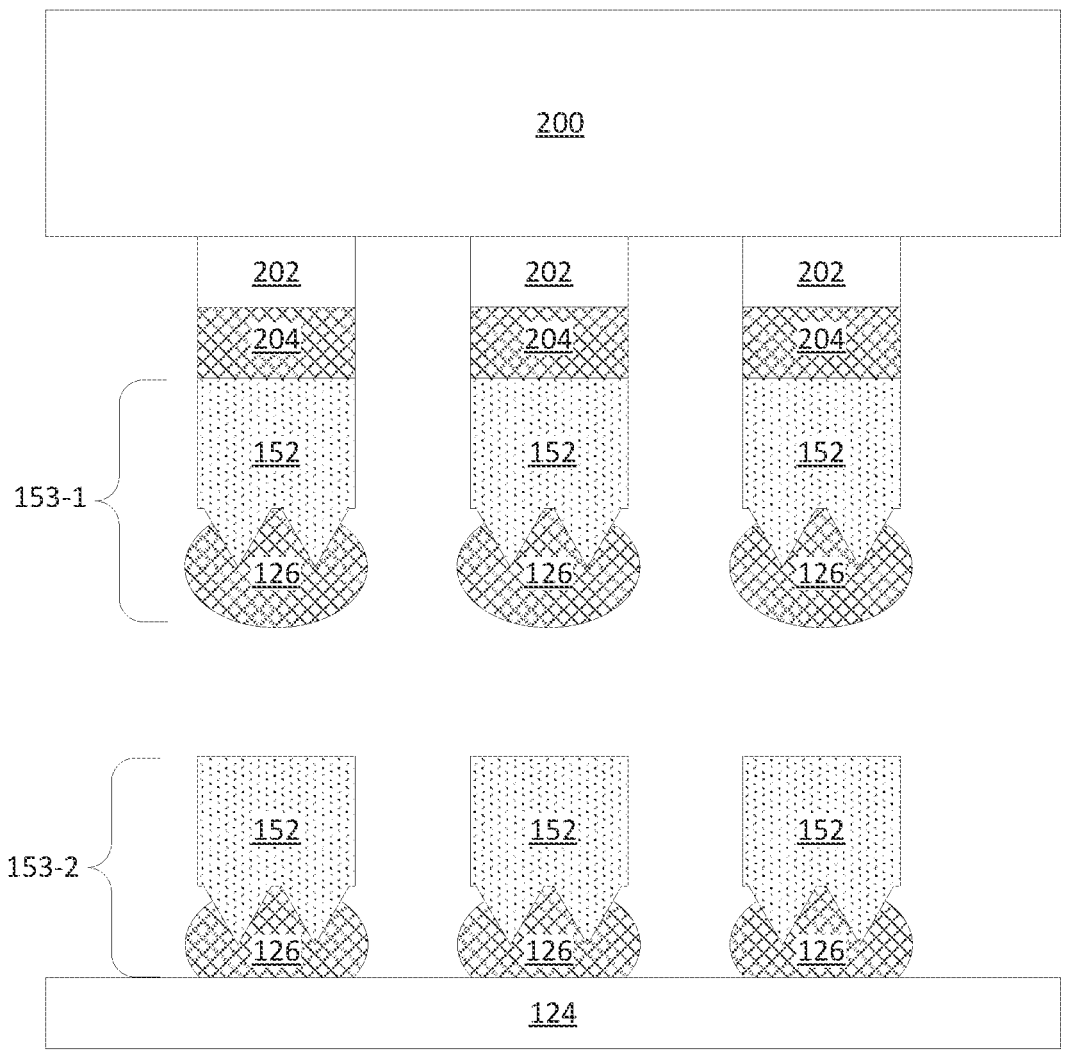
FIG. 2E is a cross-sectional view of the pillar structure shown in FIG. 2D, including a second completed structure, prior to being transferred to the transferred substrate, according to embodiments.

Referring now to FIG. 2E, this figure is a cross-sectional view of an example of a second completed structure 153-2, prior to being transferred to the transferred substrate 200 shown in FIG. 2D. It should be appreciated that the second completed structure 153-2 may be formed in the exact same manner (or a different manner) and having the exact same structure (or a different structure) as the first completed structure 153-1. For example, after the transferred pillar 152 shown in FIG. 1F is removed from the template wafer 100 (e.g., for the first completed structure 153-1), the template wafer 100 may be reused in the same manner as discussed above with respect to FIGS. 1A-1F to form the transferred pillar 152 of the second completed structure 153-2. As shown in FIG. 2E, the transferred pillar 152 of the second completed structure 153-2 is brought into proximity with the solder ball 126 of the previously transferred first completed structure 153-1.

Figure 2F:
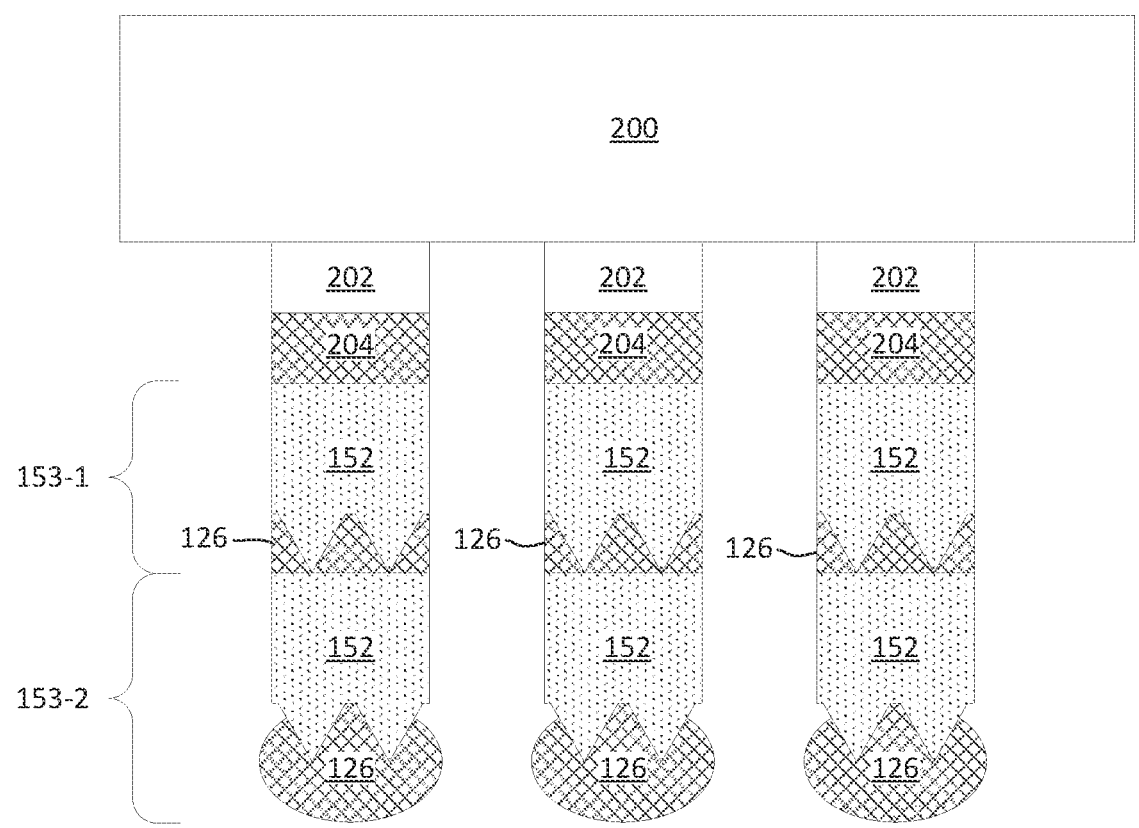
FIG. 2F is a cross-sectional view of the pillar structure shown in FIG. 2E, including the second completed structure, after being transferred to the transferred substrate, according to embodiments.

As shown in FIG. 2F, after the transferred pillar 152 of the second completed structure 153-2 comes into contact with the solder ball 126 of the first completed structure 153-1, then the solder ball 126 is the first completed structure 153-1 is reflowed to connect the transferred pillar 152 of the second completed structure 153-2 with the transferred pillar 152 of the first completed structure 153-1. In certain embodiments, the tips (i.e., the apexes of the pyramidal shaped tips) of the transferred pillar 152 of the first completed structure 153-1 are buried deep enough in the solder ball of the first completed structure 153-1 so that they come into contact with the transferred pillar 152 of the second completed structure 153-2. In other words, a post reflow height H of the solder ball 126 of the first completed structure 153-1 is the same as the height of the conical tips of the transferred pillar 152 of the first completed structure 153-1. Therefore, a well-controlled height of the overall pillar structure can be achieved if the tips are brought into contact. However, it should be appreciated that even if the tips are not brought into contact, the height may be controlled by a flip chip bonder as is known to a person of skill in the art.

Figure 2G:
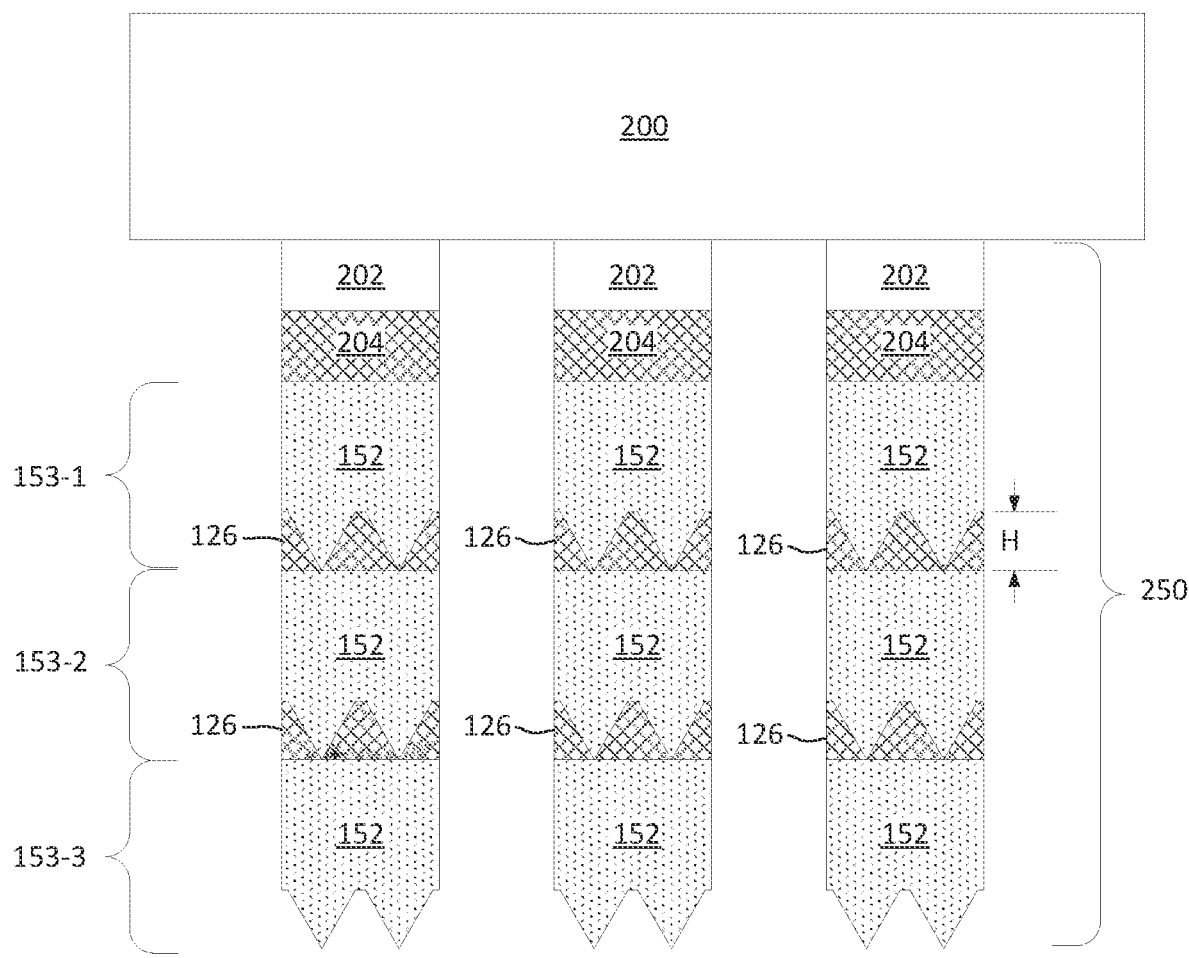
FIG. 2G is a cross-sectional view of the pillar structure shown in FIG. 2F, including a third completed structure, after being transferred to the transferred substrate, according to embodiments.

Referring now to FIG. 2G, this figure is a cross-sectional view of an example of a transferred pillar of a third completed structure 153-3, after being transferred to the transferred substrate 200 shown in FIG. 2D. It should be appreciated that the second completed structure 153-3 may be formed in the exact same manner (or a different manner) and having the exact same structure (or a different structure) as the first completed structure 153-1 and the second completed structure 153-2. Although the third completed structure 153-3 shown in FIG. 2G is shown without the addition of a solder ball 126, it should be appreciated that it may have a solder ball in other examples. Thus, as shown in FIG. 2G, a very tall (i.e., high aspect ratio) pillar structure 250 is formed by the combination of three separate completed structures. It should be appreciated that this process of combining completed structures may be repeated any suitable number of times to obtain a pillar structure 250 of the desired height for the particular application. It should be appreciated that the solder reflow operation may be performed after each individual transfer of the pillars (i.e., which may require a solder hierarchy such as a different solder composition for each successive pillar transfer level), or after the entire multi pillar structure has been formed. This combined reflow operation could be performed on a temporary carrier substrate, or on the final destination substrate.

Also, in certain embodiments, the transferrable pillars 150 may be formed as described above, where the transferrable pillars 150 are transferred to a temporary carrier, then stacked on the temporary carrier, then transferred from the temporary carrier to a device wafer, and then the solder is reflowed.

Figure 3:
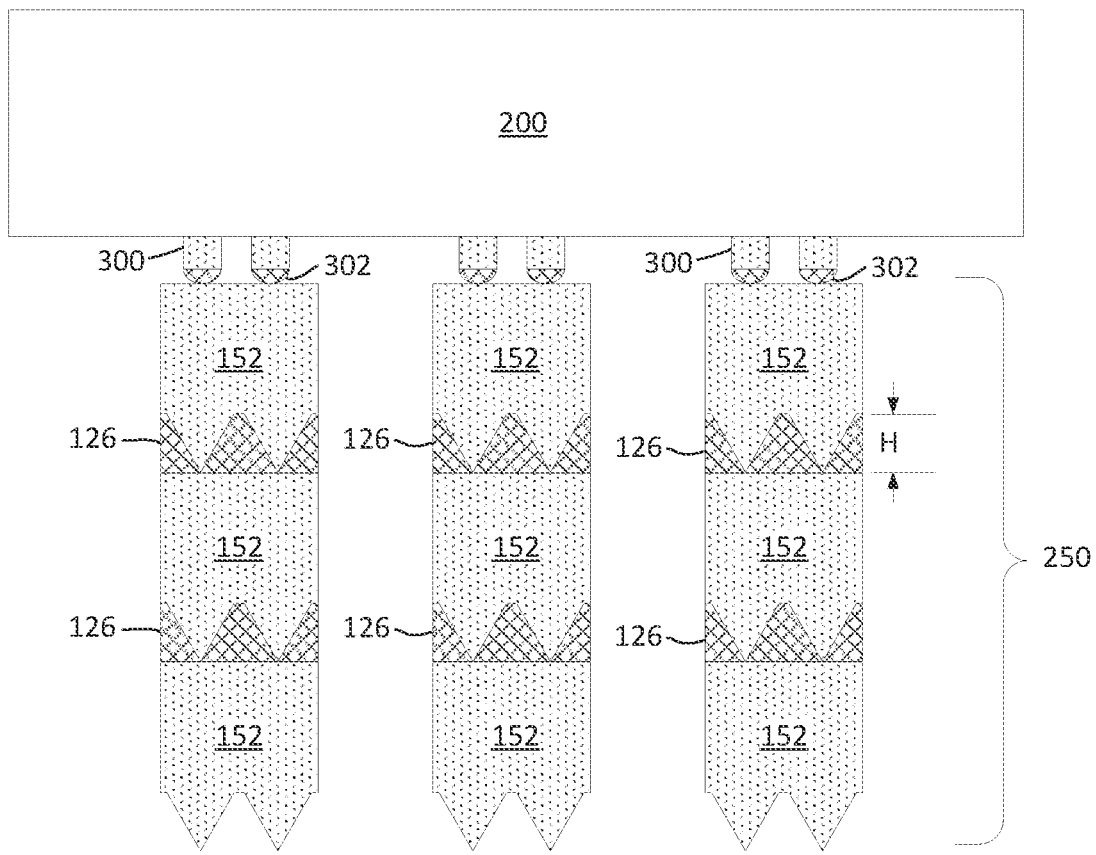
FIG. 3 is a cross-sectional view of an example of the pillar structure shown in FIG. 2G, attached to a different substrate layer configuration, according to embodiments.

Referring now to FIG. 3, this figure is a cross-sectional view of an example of a pillar structure 250 attached to a different substrate layer configuration, according to embodiments. As shown in FIG. 3, the pillar structure 250 is attached to the transferred substrate 200 via a different copper layer and solder layer configuration. In contrast to the embodiment shown in FIG. 2C, where a single copper layer 202 and a single solder layer 204 were provided for each of the pillar structures 250, in this embodiment shown in FIG. 3, a plurality of copper layers 300 and solder layers 302 are provided for each of the pillar structures. In other respects, the pillar structures 250 have the same configuration as that described above with respect to FIG. 2G.

In certain embodiments, the stack of pillars (i.e., the pillar structure 250) could already be attached to a laminate substrate (e.g., the laminate substrate 600 shown in FIG. 6A) and then the transferred substrate 200 could be joined to it. In this manner, the combination of the transferred substrate 200 and the pillar structure 250 would never be without the laminate.

Figure 4A:
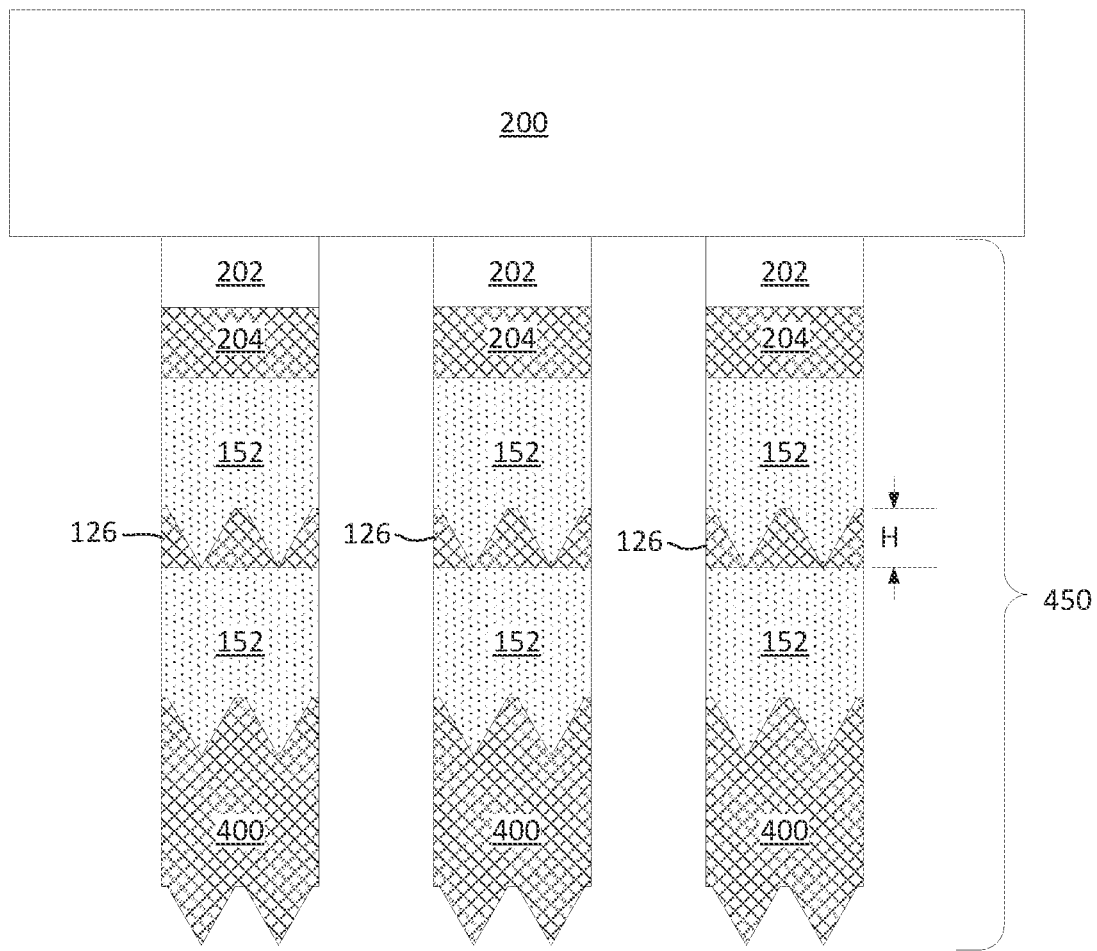
FIG. 4A is a cross-sectional view of an example of a pillar structure having a thick terminal solder layer prior to solder reflow, according to embodiments.

Referring now to FIG. 4A, this figure is a cross-sectional view of an example of a pillar structure 450 having a thick terminal solder layer 400 prior to solder reflow, according to embodiments.

Figure 4B:
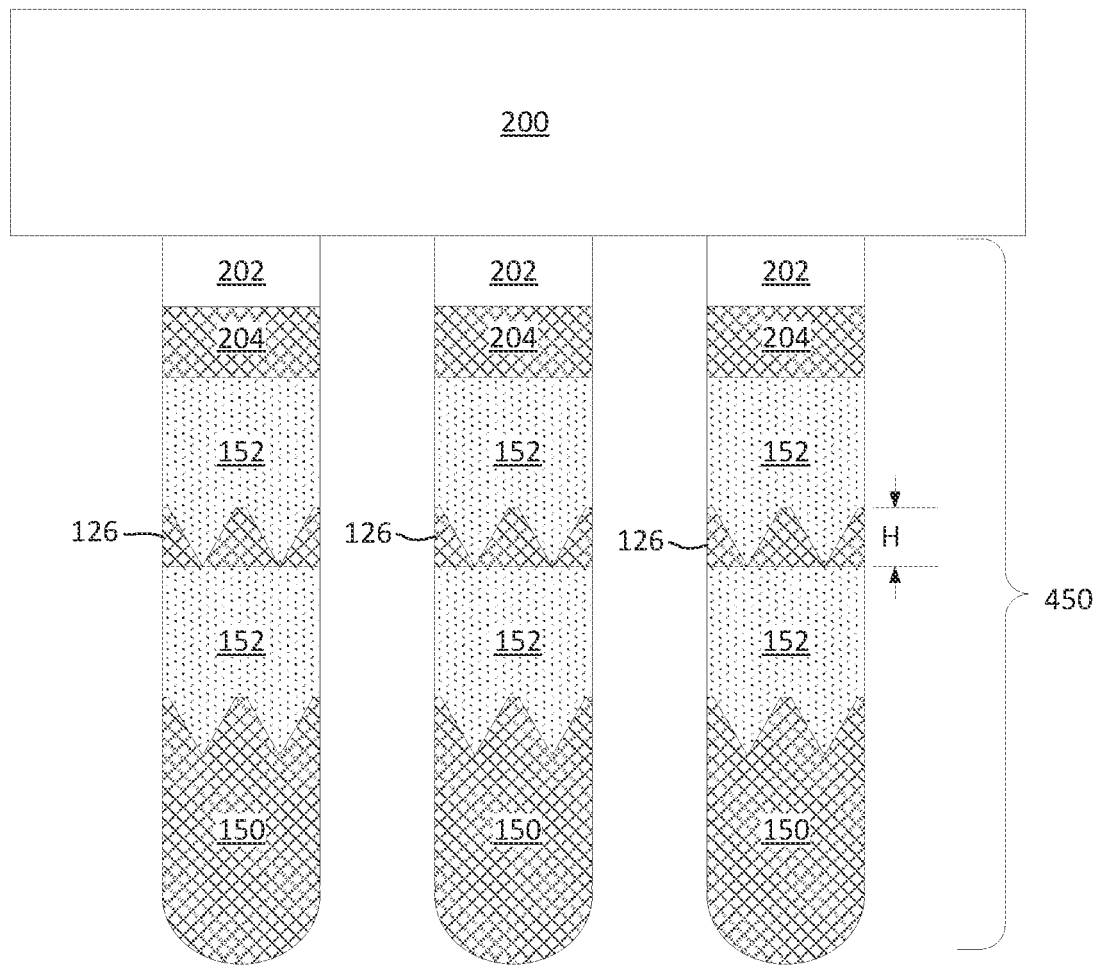
FIG. 4B is a cross-sectional view of an example of a pillar structure having a thick terminal solder layer after solder reflow, according to embodiments.

Referring now to FIG. 4B, this figure is a cross-sectional view of an example of the pillar structure 450 of FIG. 4A, having the thick terminal solder layer 400 after solder reflow, according to embodiments.

Figure 5A:
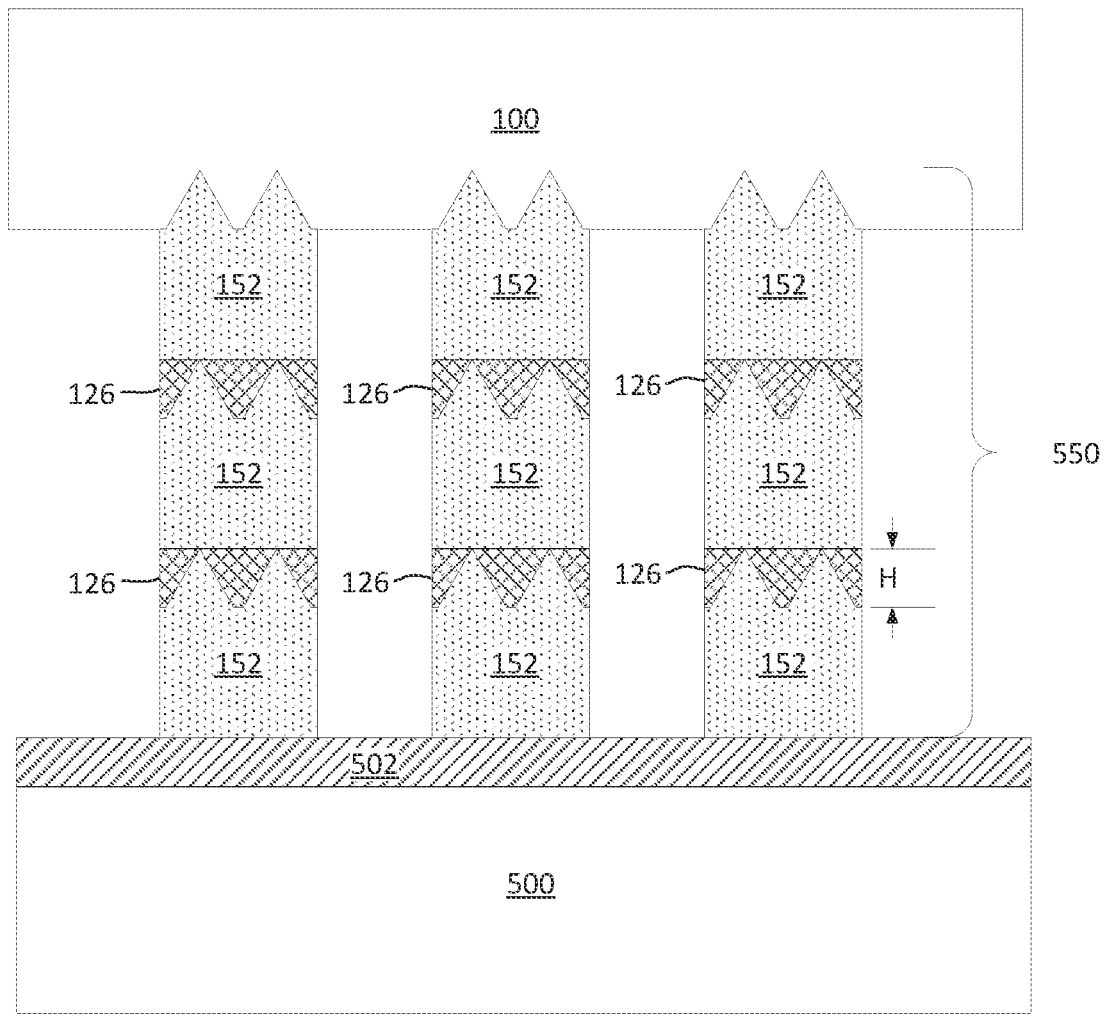
FIG. 5A is a cross-sectional view of an example of a pre-molded pillar chip including a plurality of different pillar structures, according to embodiments.
Figure 5B:
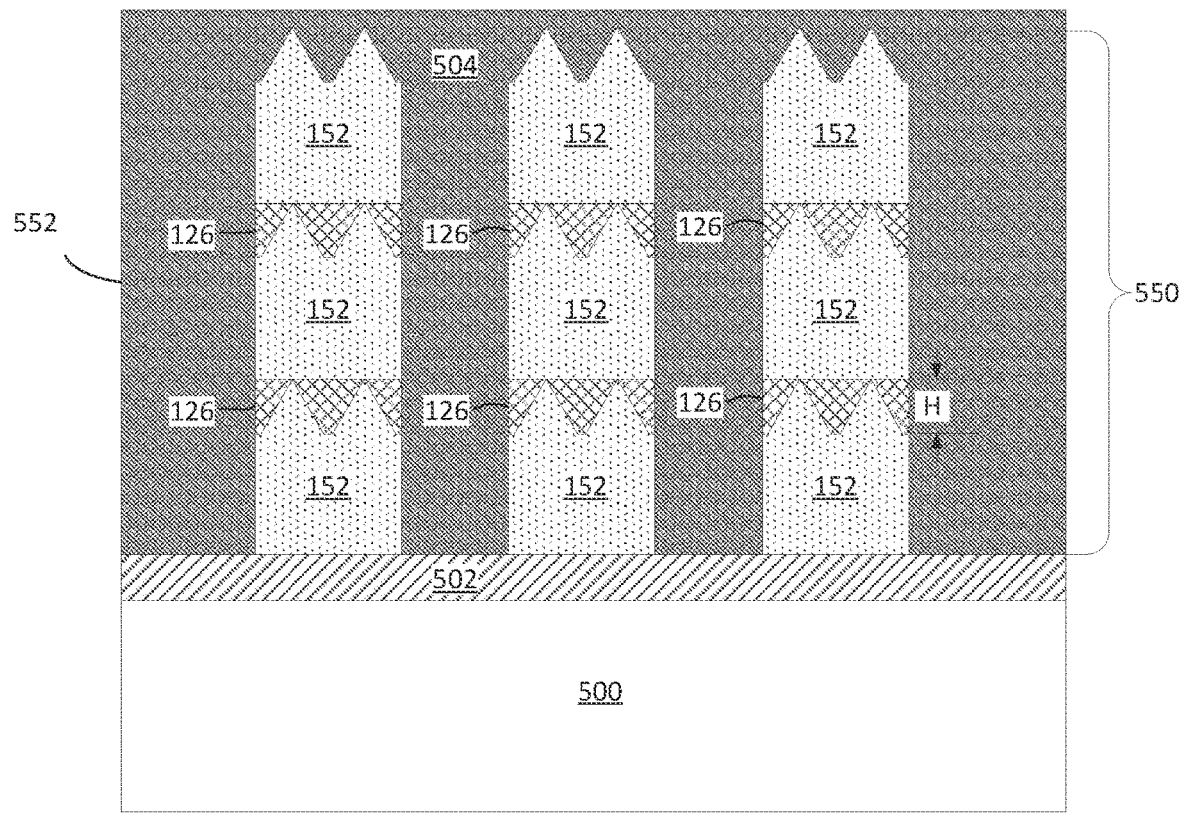
FIG. 5B is cross-sectional view of the example of the pre-molded pillar chip shown in FIG. 5A after the pillar structures have been transferred to the temporary handling substrate, according to embodiments.
Figure 5C:
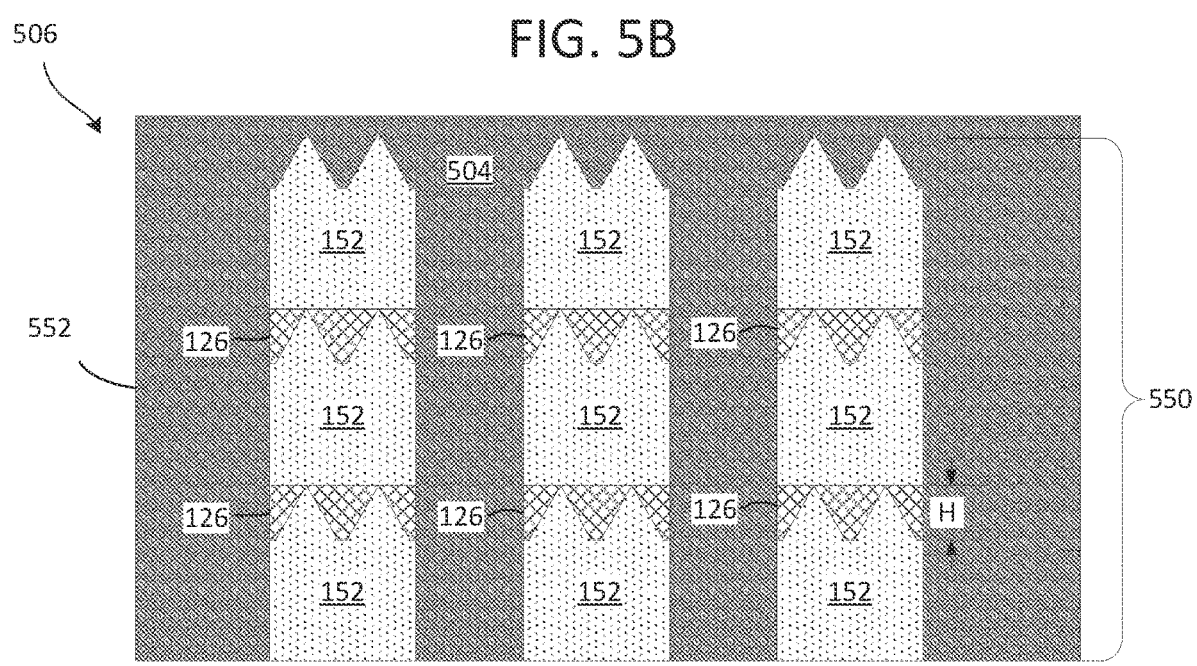
FIG. 5C is a cross-sectional view of the example of the pre-molded chip shown in FIG. 5B after the pillar structures have been transferred to the temporary handling substrate, and after the release layer and the temporary handling substrate have been removed, according to embodiments.

Referring now to FIGS. 5A-5C and initially to FIG. 5A, an example of a pre-molded pillar chip 506 including a plurality of different pillar structures 550, according to embodiments. As shown in FIG. 5A, a plurality of the pillar structures 550 (e.g., the pillar structures 250 shown in FIG. 2G or 3, or the pillar structures 450 shown in FIG. 4B) are provided on the template wafer 100 and are to be transferred to a temporary handler substrate 500. A release layer 502 may be formed on the temporary handler substrate 500 to allow for subsequent release of the pillar structures 550 from the temporary handler substrate 500.

Referring now to FIG. 5B, an example of the pre-molded pillar chip 506 shown in FIG. 5A is shown after the pillar structures 550 have been transferred to the temporary handling substrate 500, according to embodiments. As shown in FIG. 5B, the template wafer 100 has been removed, and a molding compound layer 552 is formed around the pillar structures 550.

Referring now to FIG. 5C, an example of the pre-molded chip 506 shown in FIG. 5B is shown after the pillar structures 550 have been transferred to the temporary handling substrate 500, and after the release layer 502 and temporary handling substrate 500 have been removed, according to embodiments. In certain embodiments, the temporary handling substrate 500 may be left attached during the transfer to the laminate substrate to enable a wafer level transfer process of the premolded pillars (e.g., the laminate substrate 600 shown in FIG. 6A). As shown in FIG. 5C, the release layer 502 and the temporary handling substrate 500 have been removed, leaving the pre-molded chip 506 including the plurality of pillar structures 550. In certain embodiments, the tips of the uppermost located transferred pillar 152 may be removed (not shown in FIG. 5C) by a planarization process (e.g., CMP) so that there is a flat upper surface of the pre-molded pillar chip 506. That is, the sharp pyramidal shaped tips of the transferred pillars 152 are useful for the transfer and stacking of the plurality of different transferred pillars 152 but are not useful on the uppermost located transferred pillar 152.

Figure 6A:
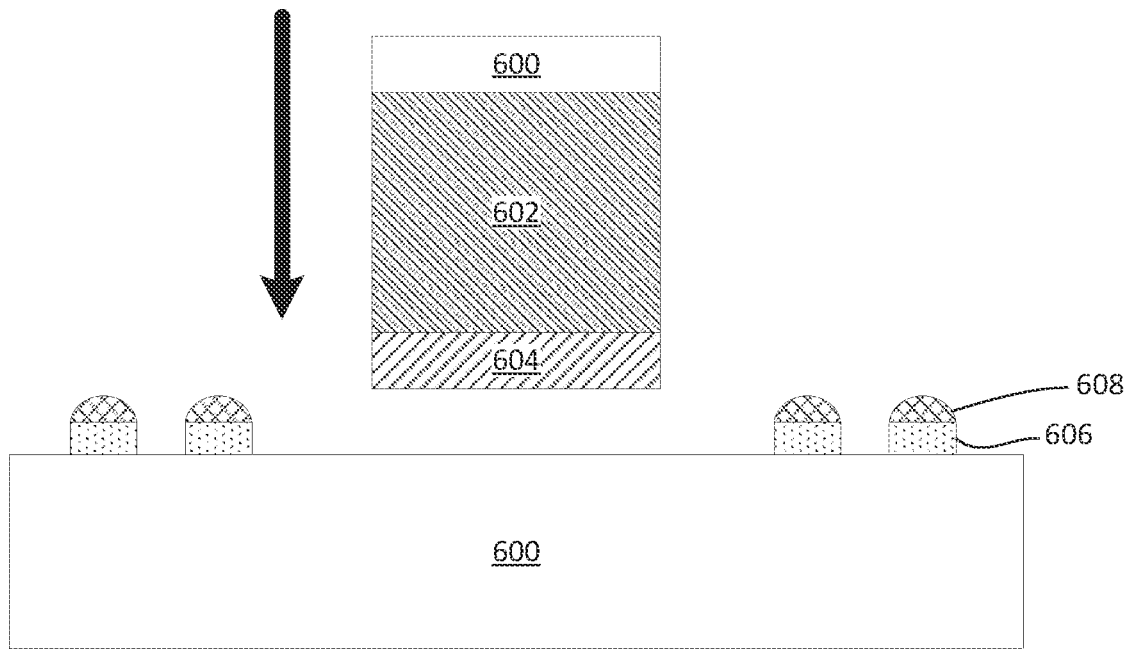
FIG. 6A is a cross-sectional view of an example of a transfer pillar structure for a fanout package-on-package (PoP) structure or a bridge structure including the pre-molded pillar chips shown in FIG. 5C, according to embodiments.

Referring now to FIGS. 6A-6E, and initially to FIG. 6A, an example of a transfer pillar structure is shown for a fanout package-on-package (PoP) structure or a bridge structure including the pre-molded pillar chips shown in FIG. 5C, according to embodiments. As shown in FIG. 6A, a laminate substrate 600 is provided. A bridge 602 is attached to the laminate substrate 600 with a die attach film (DAF) 604. As shown in FIG. 6A, the bridge 602 may be attached with the use of a laminate substrate 600 (or bridge handler substrate) attached to a top surface of the bridge 602, which is then removed after the attachment of the bridge 602. As such, the bridge 602 is attached to the top side of the laminate substrate 600 by moving the bridge 602 in the direction of the arrow shown in FIG. 6A. Laminate copper layers 606 and laminate solder bumps 608 are formed on various portions of the laminate substrate 600. The positions of these laminate copper layers 606 and laminate solder bumps 608 correspond to the positions of the pillar structures 550 within the to be attached pre-molded pillar chip 506 as discussed in further detail below.

Figure 6B:
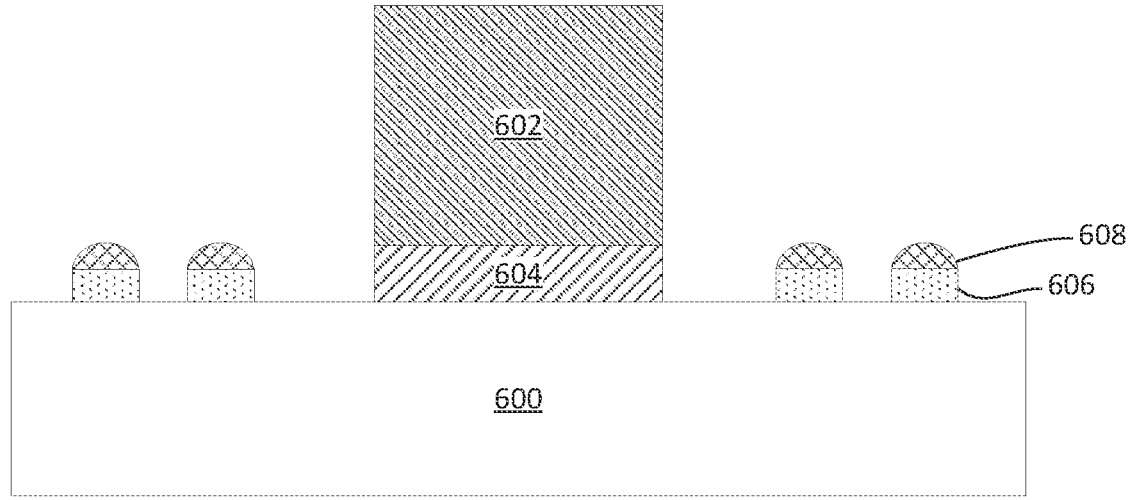
FIG. 6B is a cross-sectional view of the transfer pillar structure for the fanout package-on-package (PoP) structure or the bridge structure including the pre-molded pillar chips of FIG. 6A after the bridge has been attached to the laminate substrate, according to embodiments.

Referring now to FIG. 6B, the transfer pillar structure for the fanout package-on-package (PoP) structure or the bridge structure including the pre-molded pillar chips 506 of FIG. 6A is shown after the bridge 602 has been attached to the laminate substrate 600, according to embodiments. As shown in FIG. 6B, after the bridge 602 has been attached to the laminate substrate 600 via the DAF 604, the laminate substrate 600 (or bridge handler substrate) is removed from the top surface of the bridge 602.

Figure 6C:
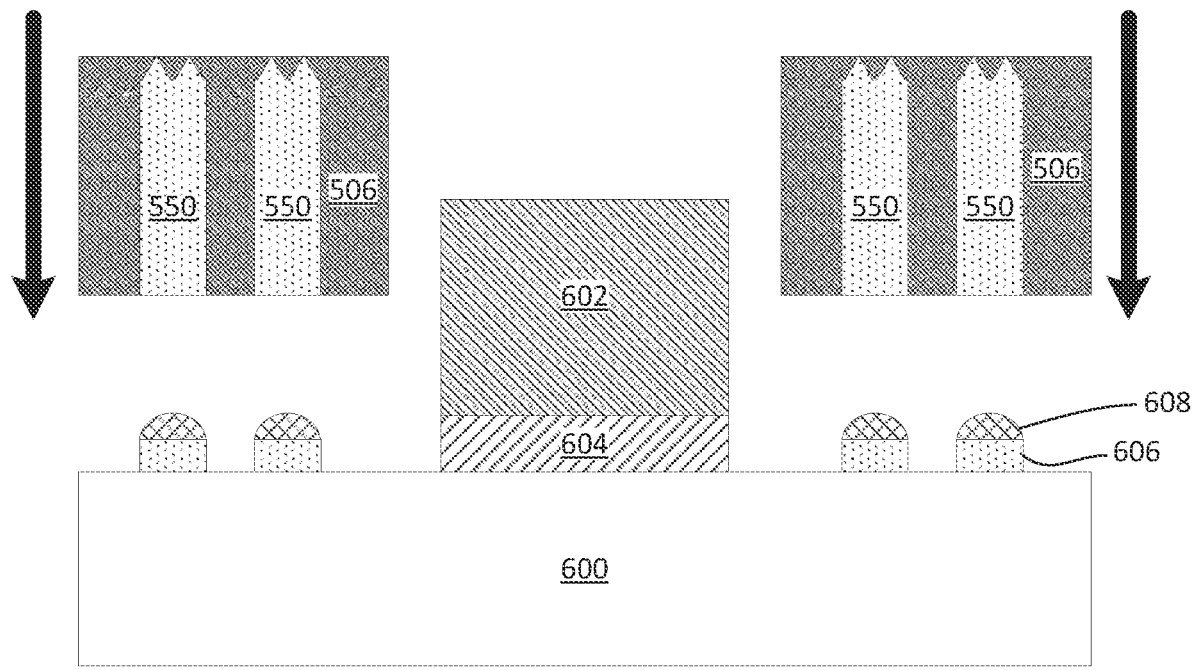
FIG. 6C is a cross-sectional view of the transfer pillar structure for the fanout package-on-package (PoP) structure or the bridge structure including the pre-molded pillar chips of FIG. 6B where the pre-molded pillar chips are brought into proximity with the surface of the laminate substrate, according to embodiments.

Referring now to FIG. 6C, the transfer pillar structure for the fanout package-on-package (PoP) structure or the bridge structure including the pre-molded pillar chips 506 of FIG. 6B is shown where the pre-molded pillar chips 506 are brought into proximity with the surface of the laminate substrate 600, according to embodiments. As shown in FIG. 6C, the pre-molded pillar chips 506 are brought into proximity with the laminate substrate 600. As discussed above, the pre-molded pillar chips 506 may be designed in such a way that the positions of the individual pillar structures 550 correspond to the locations of the laminate copper layers 606 and laminate solder bumps 608.

Figure 6D:
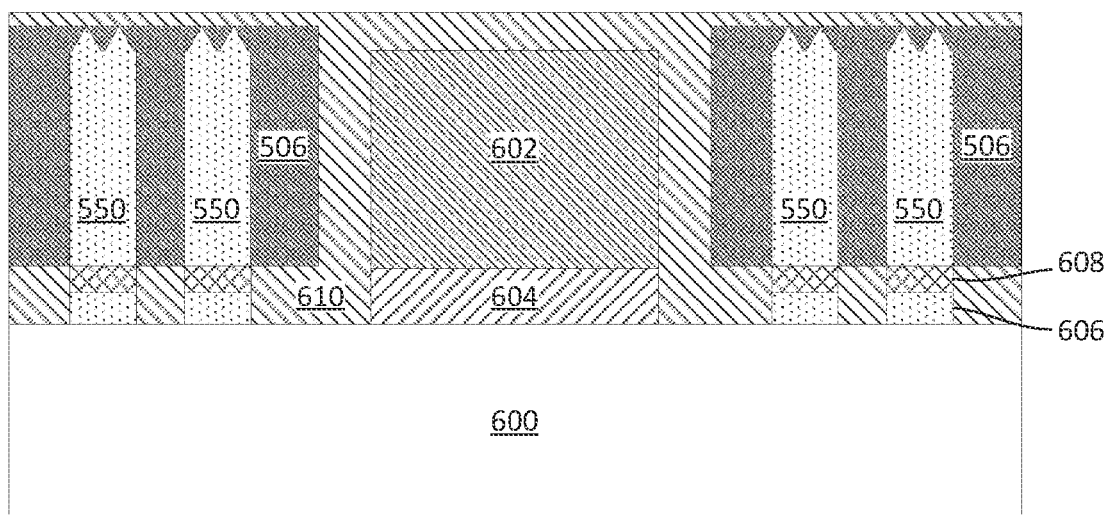
FIG. 6D is a cross-sectional view of the transfer pillar structure for the fanout package-on-package (PoP) structure or the bridge structure including the pre-molded pillar chips of FIG. 6C after the pre-molded pillar chips have been attached to the laminate substrate, according to embodiments.

Referring now to FIG. 6D, the transfer pillar structure for the fanout package-on-package (PoP) structure or the bridge structure including the pre-molded pillar chips 506 of FIG. 6C is shown after the pre-molded pillar chips 506 have been attached to the laminate substrate 600, according to embodiments. As shown in FIG. 6D, the pre-molded pillar chips 506 are brought into contact with the laminate solder bumps 608 such that the positions of the pillar structures 550 are the same as the positions of the laminate solder bumps 608. In certain embodiments, the laminate solder bumps 608 may be heated or reflowed to affix the pre-molded pillar chips 506 to the laminate substrate 600. As discussed above, it should be appreciated that the pre-molded pillar chips 506, may contain one or several of the completed structures 153 (see FIG. 2G) stacked on top of each other such that the overall height of the pillar structures 550 generally corresponds to the upper surface of the bridge 602. Thus, to the extent that there are multiple bridges 602 having different heights, the different pre-molded pillar chips 506 can be engineered to have an appropriate number of the completed structures 153 such that the height of the respective pillar structures 550 correspond to the different bridge 602 heights. Then, an underfill layer 610 (or molding compound) is added to fill in any gaps between the adjacent laminate solder bumps 608, and between the bridge 602 and the pre-molded pillar chips 506. As shown in FIG. 6D, in certain embodiments, a certain amount of the underfill layer 610 may also be added on top of the pre-molded pillar chips 506 and the bridge 602.

Figure 6E:
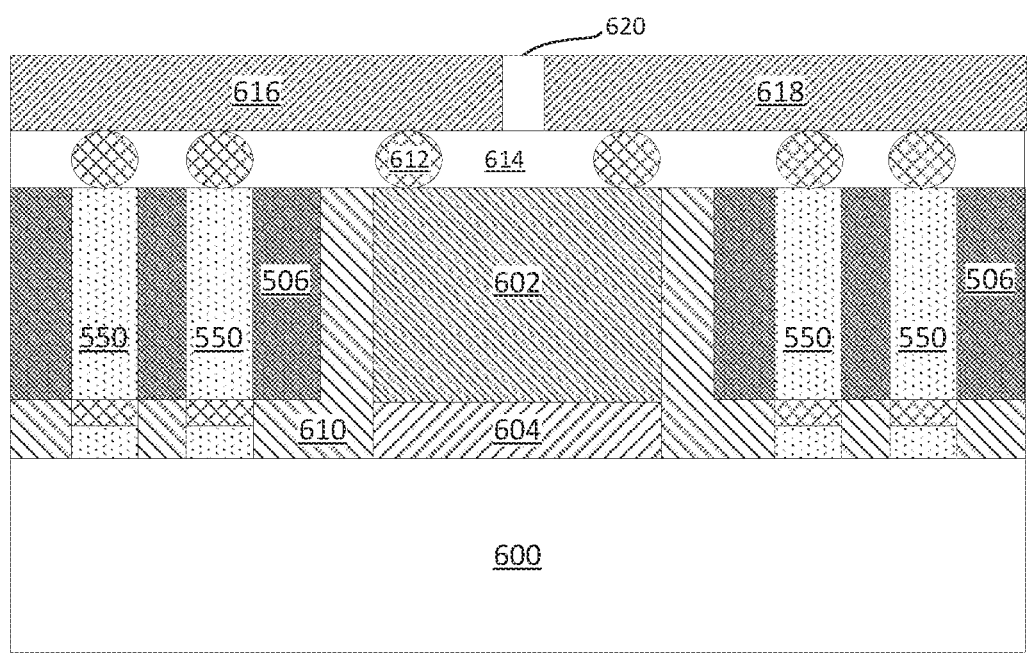
FIG. 6E is a cross-sectional view of the transfer pillar structure for the fanout package-on-package (PoP) structure or the bridge structure including the pre-molded pillar chips of FIG. 6D after a planarization process and after the addition of chips, according to embodiments.

Referring now to FIG. 6E, the transfer pillar structure for the fanout package-on-package (PoP) structure or the bridge structure including the pre-molded pillar chips 506 of FIG. 6D is shown after a planarization process and after the addition of chips, according to embodiments. As shown in FIG. 6E, the pointed surface of the tips of the pillar structures 550 are planarized using a CMP process (or other suitable material removal process). Thus, after the planarization step, the top surface of the entire pre-molded pillar chip 506 is at the same height as the top surface of the bridge 602. In certain embodiments, the bridge structure may require some type of protective film for the planarization to stop on, which can be later etched away, etc. In these embodiments, the use of such a protective film may depend on whether redistribution layers (RDLs) or pads are formed, etc. In certain embodiments, after the planarization of the structure, an optional redistribution layer (RDL), a pad, or a bumping process may be implemented. In the example shown in FIG. 6E, bumps 612 are formed. The location of the bumps 612 may correspond to certain electrical contact points on the pillar structures 550 and on the bridge 602. A first chip 616 and a second chip 618 may be attached to the overall structure by any suitable method. In certain examples, an underfill layer 614 may be added to fill in void spaces around the bumps 612. In certain examples, a molding layer 620 may be added in locations between the chips 616, 618. In certain embodiments, multiple underfills may be used, such that there may be different underfills in the bridge region versus outside the bridge region, due to differences in bump pitch, etc.

Figure 7A:
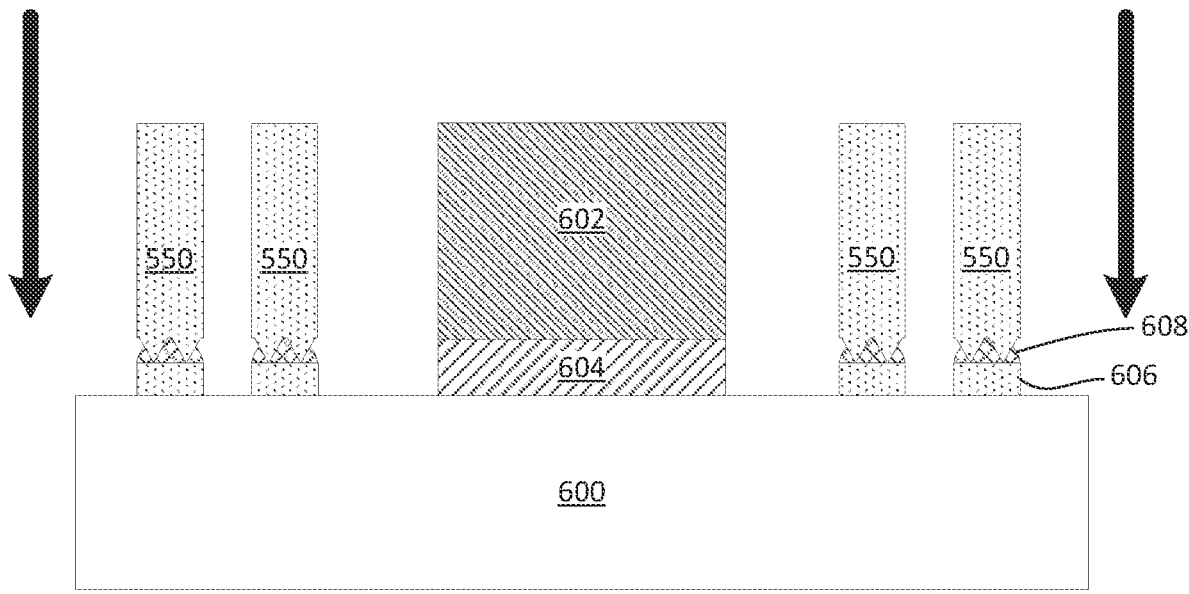
FIG. 7A is a cross-sectional view of an example of a transfer pillar structure for a fanout package-on-package (PoP) structure or a bridge structure including pillar structures that are molded after insertion, according to embodiments.

Referring now to FIGS. 7A-7D, and initially to FIG. 7A, an example of a transfer pillar structure is shown for a fanout package-on-package (PoP) structure or a bridge structure including pillar structures 550 (e.g., the pillar structures 250 shown in FIG. 2G) that are molded after insertion, according to embodiments. As shown in FIG. 7A, the pillar structures 550 are brought into contact with the laminate solder bumps 608 until the exposed tips (e.g., the pyramidal shaped tips) of the pillar structures pierce into the solder bumps 608 in a manner described above. In contrast to the embodiments described above with respect to FIGS. 6A-6E, the pillar structures 550 in this embodiments are not embedded in (or preformed in) a molded chip structure. Thus, at this stage, after the solder bumps 608 are reflowed, the high aspect ratio pillar structures 550 are freestanding structures after the removal of the transfer substrate (not shown in FIG. 7A). It is noted that in contrast to the embodiments described with respect to FIGS. 6A-6E where the tips of the pillar structures 550 are oriented at the top side of the pillar structure (i.e., away from the underlying substrate), in FIG. 7C the tips of the pillar structures 550 are oriented at the bottom side of the pillar structures 550. In this regard, it should be appreciated that depending on the nature of the transfer or the formation process of the pillar structures, it is not critical to the operation of the device which side the tips of the pillar structures are formed on.

Figure 7B:
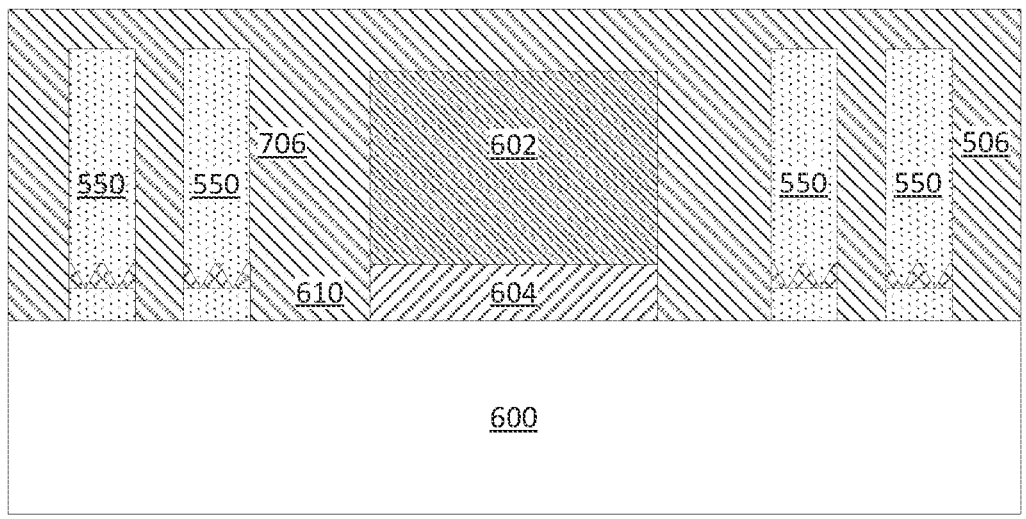
FIG. 7B is a cross-sectional view of the fanout package-on-package (PoP) structure or a bridge structure of FIG. 7A including a molding layer formed in the interstitial spaces between the vertical pillar structures.

Referring now to FIG. 7B, this figure shows a molding layer 706 formed in the interstitial spaces between the vertical pillar structures 550.

Figure 7C:
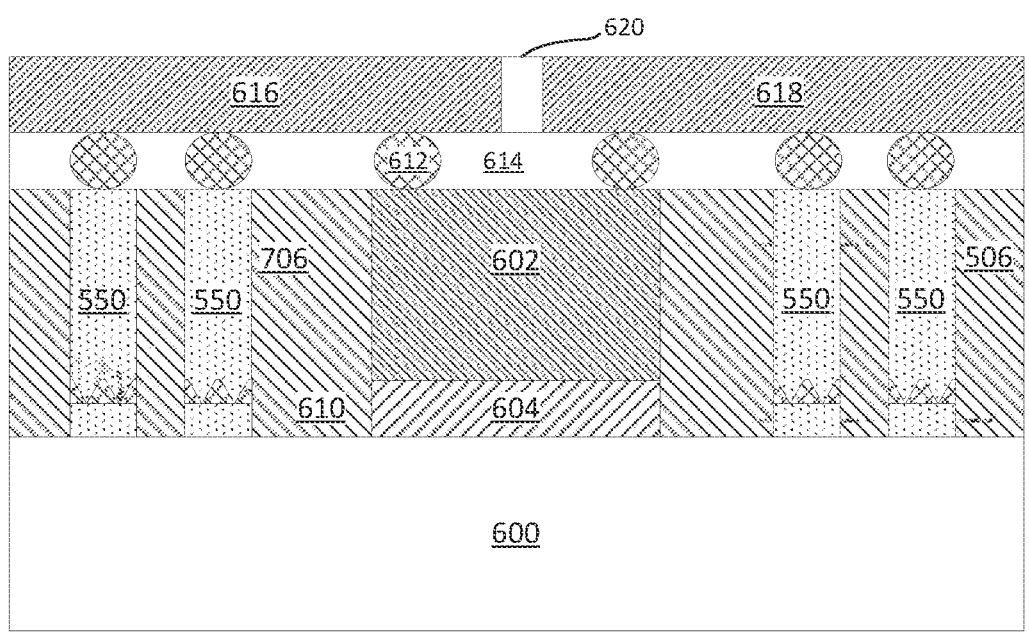
FIG. 7C is a cross-sectional view of the fanout package-on-package (PoP) structure or a bridge structure of FIG. 7B, where the pillar structures are planarized using a CMP process.

As shown in FIG. 7C, the pillar structures 550 are planarized using a CMP process (or other suitable material removal process). Thus, after the planarization step, the top surface of the entire pillar structures 550 at the same height as the top surface of the bridge 602. In certain embodiments, after the planarization of the structure, an optional redistribution layer (RDL), a pad, or a bumping process may be implemented. In the example shown in FIG. 7C, bumps 612 are formed. The location of the bumps 612 may correspond to certain electrical contact points on the pillar structures 550 and on the bridge 602. A first chip 616 and a second chip 618 may be attached to the overall structure by any suitable method. In certain examples, an underfill layer 614 may be added to fill in void spaces around the bumps 612. In certain examples, a molding layer 620 may be added in locations between the chips 616, 618.

Figure 7D:
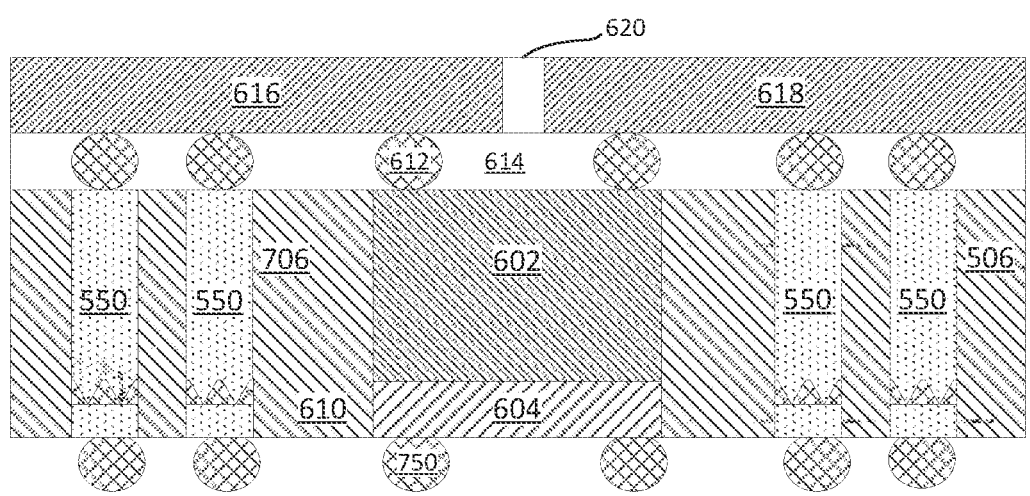
FIG. 7D is a cross-sectional view of an example of the transfer pillar structure of FIG. 7C after the removal of the laminate substrate, according to embodiments.

Referring now to FIG. 7D, an example of the transfer pillar structure of FIG. 7C is shown after the removal of the laminate substrate 600, according to embodiments. As shown in FIG. 7D, the laminate substrate 600 (or carrier or temporary substrate) has been removed, and various interconnect bumps 750 have been added. It should be appreciated that (although not shown in FIG. 7D) any suitable number or variety of interconnect features may be added to electrically connect the interconnect bumps 750 to the bridge 602 and the different pillar structures 550.

Figure 8A:
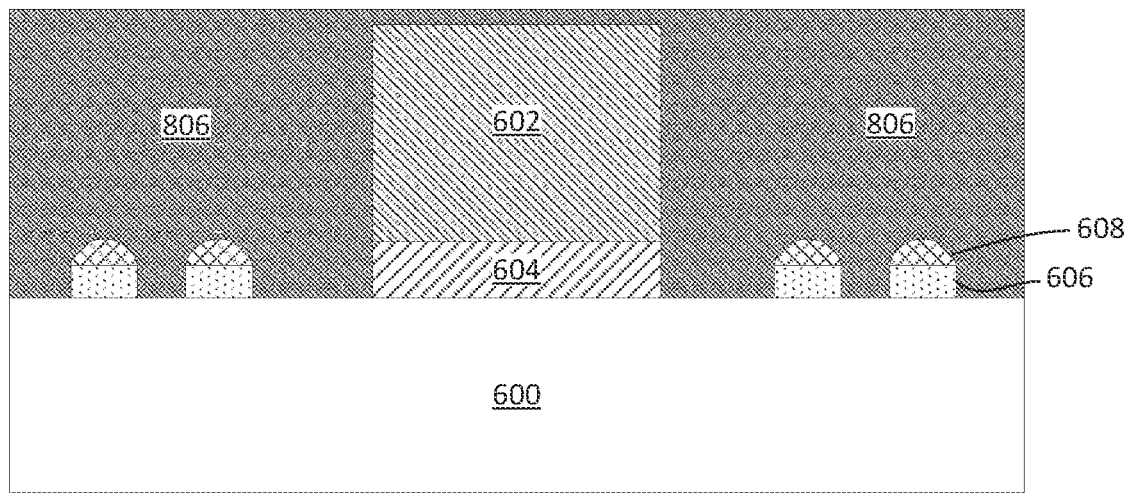
FIG. 8A is a cross-sectional view of an example of a transfer pillar structure for a fanout package-on-package (PoP) structure or a bridge structure including pillar structures that are inserted into preformed b-stage underfill/thermal plastic molding compound, according to embodiments.
Figure 8B:
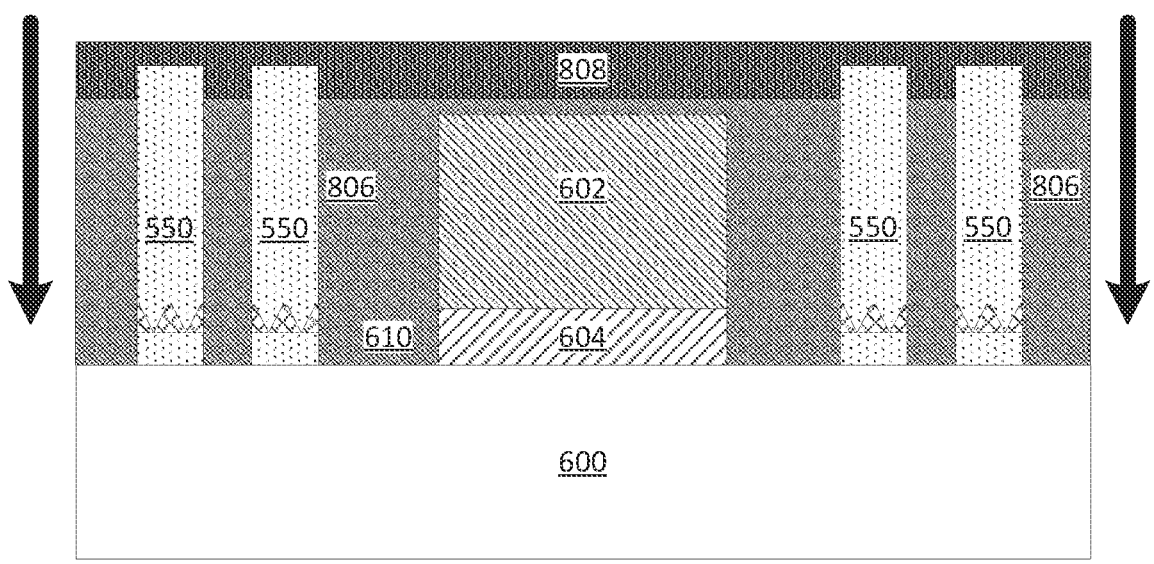
FIG. 8B is a cross-sectional view of the pillar structures of the device of FIG. 8A being inserted into a molding compound layer, according to embodiments.
Figure 8C:
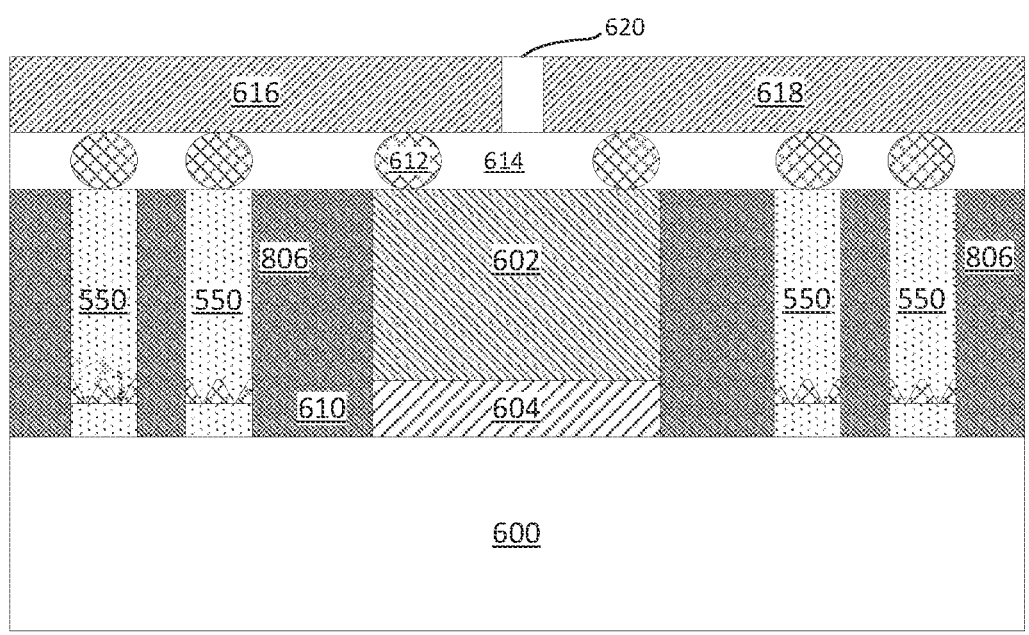
FIG. 8C is a cross-sectional view of the fanout package-on-package (PoP) structure or a bridge structure of FIG. 8B, where the pillar structures are planarized using a CMP process.

Referring now to FIGS. 8A-8C, and initially to FIG. 8A, an example of a transfer pillar structure is shown for a fanout package-on-package (PoP) structure or a bridge structure including pillar structures 550 (e.g., the pillar structures 250 shown in FIG. 2G) that are inserted into preformed b-stage underfill/thermal plastic molding compound, according to embodiments. As shown in FIG. 8A, a molding compound layer 806 (or b-stage underfill) is formed over the laminate substrate 600 above and around the laminate copper layer 606, the laminate solder bumps 608, the DAF 604 and the bridge 602. In certain examples, the molding compound layer 806 is formed to a height that is above the top surface of the bridge 602.

Referring now to FIG. 8B, this figure shows the pillar structures 550 (which are attached to a temporary transfer substrate 808) being inserted into the molding compound layer 806 in the direction of the arrows. As in the other embodiments described above, the tall pillars can be formed with single or multi-stacked transferred pillars and inserted into this b-stage underfill (or molding compound layer 806) with high filler contents.

As shown in FIG. 8C, the pillar structures 550 are planarized using a CMP process (or other suitable material removal process). Thus, after the planarization step, the top surface of the entire pillar structures 550 at the same height as the top surface of the bridge 602. In certain embodiments, after the planarization of the structure, an optional redistribution layer (RDL), a pad, or a bumping process may be implemented. In the example shown in FIG. 7C, bumps 612 are formed. The location of the bumps 612 may correspond to certain electrical contact points on the pillar structures 550 and on the bridge 602. A first chip 616 and a second chip 618 may be attached to the overall structure by any suitable method. In certain examples, an underfill layer 614 may be added to fill in void spaces around the bumps 612. In certain examples, a molding layer 620 may be added in locations between the chips 616, 618.

In certain embodiments, electrical testing may be performed on the transferrable pillar stack to ensure that the solder reflow operation was successful, and that the pillar structures are conductive. Depending on how the pillar structures are fabricated the electrical testing may be performed one or more times, and this testing may be performed before or after solder reflow.

Thus, the present embodiments utilize a transferrable pillar method to create a pillar structure on a separate substrate and selectively transfer the structures to the desired package to form offsets for a chip in a fanout package or a bridge structure. This process can be repeatedly performed to further increase the total pillar structure height, without being limited by aspect ratio.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A pillar structure comprising:
a plurality of pillars, each pillar including
a capping material layer formed in a pit etched into a template wafer,
a conductive plug formed on the capping material layer,
a base layer formed on the conductive plug, and
an attach material layer formed on the base layer,
wherein the pillars are joined vertically together to form the pillar structure.

2. The pillar structure of claim 1, wherein the attach material layer is a solder material.

3. The pillar structure of claim 1, wherein the pillar structure is embedded in a pre-molded chip.

4. The pillar structure of claim 1, wherein each of the pillars include a tip that corresponds to a shape of the pit formed into the template wafer.

5. The pillar structure of claim 4, wherein the tip has a conical or pyramidal shape.

6. The pillar structure of claim 1, wherein the pillar structures to a fanout PoP structure or a bridge structure, and wherein a molding layer is formed to fill spaces between the pillar structures.

7. The pillar structure of claim 6, wherein a first one of the pillar structures includes a first number of pillars, and a second one of the pillar structures includes a second number of pillars that is different than the first number of pillars.

8. The pillar structure of claim 1, wherein each of the pillars has a pointed tip corresponding to a shape of the pit, and wherein the pointed tip is deformed.

9. A bridge structure comprising:
a substrate;
a bridge formed on the substrate;
a plurality of pillars, each pillar including
a capping material layer,
a conductive plug formed on the capping material layer,
a base layer formed on the conductive plug, and
an attach material layer formed on the base layer; and
at least one chip formed on top of the at least one pillar,
wherein the pillars are joined vertically together to form a pillar structure.

10. The bridge structure of claim 9, wherein each of the pillars has a pointed tip.

* * * * *